United States Patent
Yaroshchuk et al.

(10) Patent No.: US 8,767,153 B2
(45) Date of Patent: Jul. 1, 2014

(54) ALIGNMENT FILM FOR LIQUID CRYSTALS OBTAINABLE BY DIRECT PARTICLE BEAM DEPOSITION

(75) Inventors: Oleg Yaroshchuk, Kyiv (UA); Eugene Telesh, Minsk (BY); Aleksander Khokhlov, Minsk (BY)

(73) Assignee: Merck Patent GmbH, Darmstadt (DE)

( * ) Notice: Subject to any disclaimer, the term of this patent is extended or adjusted under 35 U.S.C. 154(b) by 522 days.

(21) Appl. No.: 12/919,843

(22) PCT Filed: Feb. 3, 2009

(86) PCT No.: PCT/EP2009/000704
§ 371 (c)(1),
(2), (4) Date: Aug. 27, 2010

(87) PCT Pub. No.: WO2009/106208
PCT Pub. Date: Sep. 3, 2009

(65) Prior Publication Data
US 2011/0007255 A1    Jan. 13, 2011

(30) Foreign Application Priority Data
Feb. 29, 2008  (EP) .................................... 08003843

(51) Int. Cl.
*G02F 1/1337* (2006.01)

(52) U.S. Cl.
USPC ........... 349/123; 349/124; 349/125; 349/126; 349/127; 349/128

(58) Field of Classification Search
USPC ............ 349/84, 123, 124, 125, 127, 128, 129
See application file for complete search history.

(56) References Cited

U.S. PATENT DOCUMENTS

| | | | |
|---|---|---|---|
| 4,261,650 A | 4/1981 | Sprokel | |
| 4,862,032 A | 8/1989 | Kaufman et al. | |
| 6,632,483 B1 | 10/2003 | Cesare Callegari et al. | |
| 6,867,837 B2 | 3/2005 | Fijol | |
| 7,123,330 B2 * | 10/2006 | Kondoh | 349/125 |
| 7,525,107 B2 | 4/2009 | Nakagaki et al. | |
| 7,532,300 B2 * | 5/2009 | Tang et al. | 349/187 |

(Continued)

FOREIGN PATENT DOCUMENTS

| | | |
|---|---|---|
| EP | 1326130 B1 | 7/2003 |
| JP | 63 108646 | 5/1988 |

(Continued)

OTHER PUBLICATIONS

International Search Report of PCT/EP2009/000704 (Feb. 3, 2009).

(Continued)

*Primary Examiner* — Jennifer Doan
(74) *Attorney, Agent, or Firm* — Millen, White, Zelano & Branigan, P.C.

(57) ABSTRACT

The invention relates to a process of preparing an alignment film for the alignment of liquid crystals (LCs) or reactive mesogens (RMs), by a direct particle beam deposition process, to an alignment film obtainable by said process, to the use of said alignment film for the alignment of LCs or RMs, especially in the form of thin layers, to a multilayer comprising said alignment film and one or more LC and/or RM layers, and to the use of the alignment film and multilayer in optical, electronic and electrooptical applications.

21 Claims, 12 Drawing Sheets

(56) References Cited

U.S. PATENT DOCUMENTS

| | | |
|---|---|---|
| 2002/0135721 A1 | 9/2002 | Fijol |
| 2004/0151911 A1 | 8/2004 | Callegari et al. |
| 2005/0140882 A1 | 6/2005 | Park |
| 2006/0150912 A1 | 7/2006 | Callegari et al. |
| 2006/0209241 A1 | 9/2006 | Chien et al. |
| 2008/0011969 A1 | 1/2008 | Nakagaki et al. |
| 2009/0109387 A1 | 4/2009 | Sakai et al. |
| 2010/0020284 A1 | 1/2010 | Parri et al. |

FOREIGN PATENT DOCUMENTS

| | | |
|---|---|---|
| JP | 2002 62532 | 2/2002 |
| JP | 2004 109171 | 4/2004 |
| JP | 2004 526989 | 9/2004 |
| JP | 2005 156807 | 6/2005 |
| JP | 2005 173371 | 6/2005 |
| JP | 2005 196109 | 7/2005 |
| JP | 2007 163711 | 6/2007 |
| JP | 2008 165221 | 7/2008 |
| WO | WO-02 059689 | 8/2002 |
| WO | WO 2004/104682 A1 | 12/2004 |
| WO | WO 2008/028553 A1 | 3/2008 |
| WO | WO-2008 072528 | 6/2008 |

OTHER PUBLICATIONS

P. J. Martin et al., "Alignment and Switching Behaviors of Liquid Crystal on a-SiO$_x$ Thin Films Deposited by a Filtered Cathodic Arc Process," Applied Physics Letters, vol. 91 (2007) pp. 063516-1-063516-3.

European Search Report for EP 10 01 3870 dated Mar. 3, 2011.

Son, P. K. et al., "Vertical alignment of liquid crystal on $a$-SiO$_x$ thin film using the ion beam exposure," Applied Physics Letters, 2006, vol. 88.

Son, P. K. et al., "Vertical alignment of liquid crystal on a-SiOx thin film using the ion beam exposure," Applied Physics Letters, 2006, vol. 88.

Asahi Glass Co Ltd., "Antireflection body and display device using the same," Patent Abstracts of Japan, Publication Date: Jun. 30, 2005; English Abstract of JP-2005 173371.

Chi Mei Electronics Corp, "Liquid Crystal Display," Patent Abstracts of Japan, Publication Date: Jun. 16, 2005; English Abstract of JP-2005 156807.

Dainippon Printing Co Ltd., "Opitcal film, its manufacturing method and liquid crystal display device," Patent Abstracts of Japan, Publication Date: Apr. 8, 2004: English Abstract of JP-2004 109171.

English Translation of Office Action for related Taiwan Patent Application No. 098106492 dated Apr. 7, 2014.

English Abstract of Taiwan 200632480 A, dated Sep. 16, 2006.

* cited by examiner

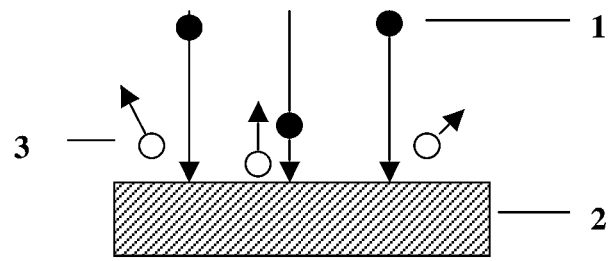
Figure 1a
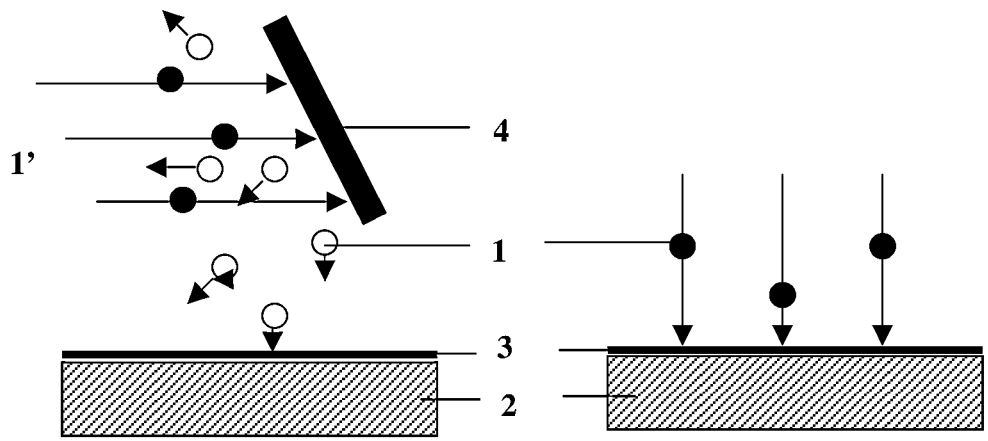
Figure 1b        Figure 1c

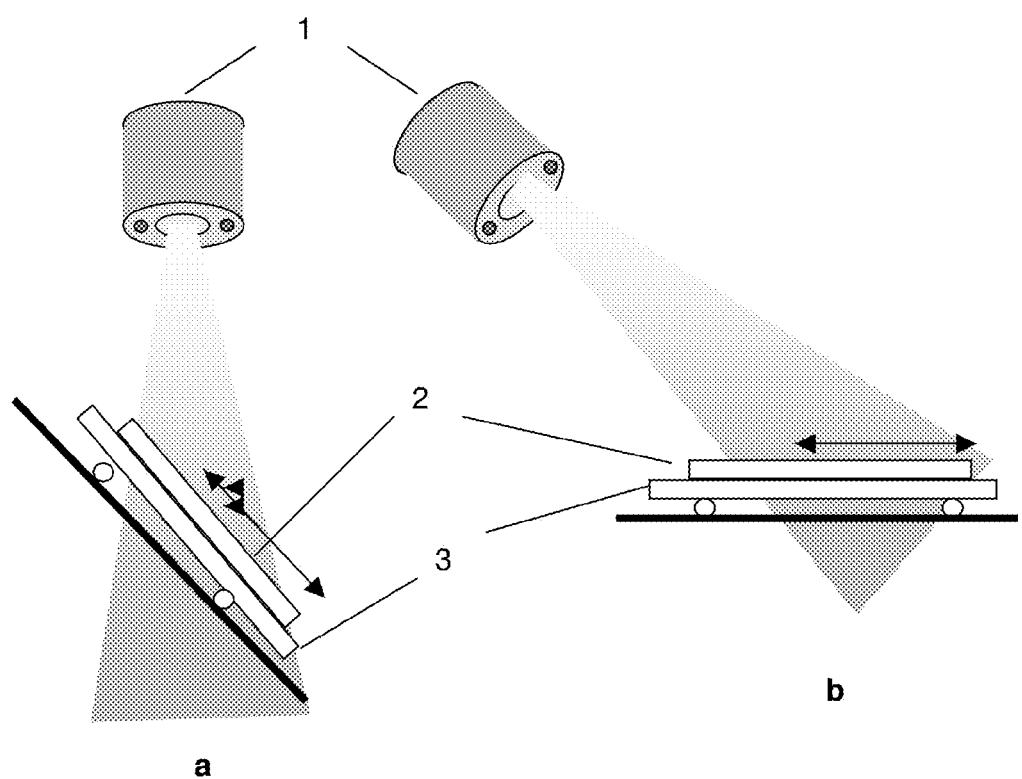
Figure 3a, b

ALIGNMENT FILM FOR LIQUID CRYSTALS OBTAINABLE BY DIRECT PARTICLE BEAM DEPOSITION

FIELD OF THE INVENTION

The invention relates to a process of preparing an alignment film for the alignment of liquid crystals (LCs) or reactive mesogens (RMs), by a direct particle beam deposition process, to an alignment film obtainable by said process, to the use of said alignment film for the alignment of LCs or RMs, especially in the form of thin layers, to a multilayer comprising said alignment film and one or more LC and/or RM layers, and to the use of the alignment film and multilayer in optical, electronic and electrooptical applications.

BACKGROUND AND PRIOR ART

In many optical and electrooptical devices, like liquid crystal displays (LCDs), which comprise thin layers of an LC material provided on a substrate or between two substrates, it is often required to achieve uniform alignment of the LC material. Depending on the display mode it is for example desired to have planar alignment where the LC molecules are oriented with their long molecular axis parallel to the substrate, homeotropic alignment where the LC molecules are oriented with their long molecular axis perpendicular to the substrate, or tilted alignment where the LC molecules are oriented with their long molecular axis at an angle to the substrate.

The most conventional method described in prior art to achieve planar or tilted LC alignment is rubbing the substrate surface. This mechanical treatment has a big number of disadvantages, such as surface damaging, charging and dusting, complexity of patterning, and insufficient alignment uniformity on a microscopic level.

The intrinsic problems of LC rubbing alignment techniques stimulated the development of alternative alignment processes. Among them the so-called particle beam alignment methods show good promise for industrial applications. As the particles ions, neutral atoms, electrons, or mixtures thereof, in particular a plasma, can be used.

One can select three fundamental particle beam processes showing especially good promise for LC alignment:
1) surface etching,
2) sputtering deposition,
3) direct deposition.

The different processes mentioned above may occur simultaneously, but their efficiency depends on the energy of the particles. All three processes are discussed below and are schematically presented in FIG. 1.

In case of process 1) as shown in FIG. 1a, if the beam of accelerated (1) particles has an energy of 100 eV-10,000 eV, the so-called surface etching/milling process is preferred. In this case particles (1) bombarding the substrate (2) extract the substrate's atoms (3) and do thereby cause material ablation. This may be accompanied by braking chemical bonds and, in case of reactive gases, by plasma chemical reactions. This so-called surface etching process is mainly used for surface cleaning.

In case of process 2) as shown in FIG. 1b, if an accelerated beam of particles (1') having an energy of 100 eV-10,000 eV is directed to any other substrate (4) (target), it causes material ablation from the target (4). The extracted particles (1) have a lower energy (<100 eV) and can be deposited on the desirable substrate (2) forming a film (3) thereon. This process is known as particle beam sputtering deposition.

Finally, in case of process 3) as shown in FIG. 1c, if a beam of particles (1) having very low energy (far less than 100 eV) is directed on the substrate (2), the particles have not enough energy to extract substrate's atoms. Instead, they may condense and react on the substrate forming a permanent film (3) thereon. This process is hereinafter referred to as direct (particle beam) deposition.

This classification includes only methods dealing with particle beams formed by ion and plasma beam sources. It does not include thermally initiated particle beams and associated methods like physical and chemical vapour deposition, which are much less convenient for LC technology, especially in case of coating large-area substrates.

To ensure uniform alignment of the LC molecules, the particle beam is usually directed obliquely to the alignment substrate. In this case, the surface of the modified film (in case of etching methods) or of the deposited film (in case of deposition methods) becomes anisotropic and thereby capable to align LCs. The induced surface anisotropy reveals itself in an anisotropy of relief and an anisotropy of molecular or intermolecular bonds.

Among the above-mentioned particle beam processes, surface etching 1) is the process most actively studied for LC alignment, and is disclosed for example in U.S. Pat. No. 4,153,529; P. Chaudhari, J. Lacey, S. A. Lien, and J. Speidell, *Jpn J Appl Phys* 37(1-2), L55-L56 (1998); P. Chaudhari et al, *Nature* 411, 56-59 (2001). In contrast to first attempts of etching alignment, in which particles of rather high energy (several keV) are used, in later experiments the energy is reduced to 0.1 keV. This allowed to treat only the very top layer of the alignment film so that surface deterioration is minimized. This technique provides low-pretilt alignment of good uniformity on the huge variety of organic and inorganic substrates.

By using plasma beam sources of linear construction, the etching technique is applied for the alignment treatment of large-area substrates used in modern LCD technology, as disclosed for example in WO2004/104682 A1. Recently, the etching process has also been proposed for the alignment of polymerizable LCs, also known as "reactive mesogens" (RMs), as disclosed in PCT/EP/2007/007078, and of solidified mesogens, as reported in O. Yaroshchuk et al., *J. Soc. Inf. Display* 16, 905 (2008).

The sputtering deposition method 2) is currently widely used as a laboratory tool for alignment of conventional LCs. As alignment films, $SiO_x$ coatings are usually applied. However, in spite of the prevalence of the sputtering method, it is not used as industrial alignment tool. The method is disclosed for example in U.S. Pat. No. 5,529,817, U.S. Pat. No. 5,529,817, U.S. Pat. No. 5,658,439. Matahiro and Taga, *Thin Solid Films* 185, 137-144 (1990) discloses a comparison of sputtering deposition and vapor deposition techniques. An insight in this alignment technology is also given in J. SID., 14/3, 257 (2006).

However, the etching and sputtering processes known in prior art do also have several disadvantages hindering their industrial application. For example, although it may achieve high alignment uniformity, the etching alignment process is still not industrialized because of alignment aging problems, i.e. alignment degradation with a storage time of LC cells. To overcome this problem, alignment materials and processing conditions should be thoroughly optimized, as reported in O. Yaroshchuk, R. Kravchuk, L. Dolgov, A. Dobrovolskyy, N. Klyui, E. Telesh, A. Khokhlov, J. Brill, N. Fruehauf, "Aging of LC alignment on plasma beam treated substrates: choice of alignment materials and liquid crystals", *Mol. Cryst. Liq. Cryst*, 479, 111-120 (2007). In contrast to conventional LCs, the aging problem is less critical for RMs. The etching process can provide highly uniform planar alignment of RMs on a big number of substrates without any intermediate layers. However, this process is not very effective for homeotropic alignment. Also, RM alignment is frequently influenced by the properties of the substrate.

The sputtering deposition process supplements etching, because it is especially effective for (tilted and untilted) vertical alignment. However, problems do often occur in this method regarding alignment uniformity and alignment stability. Therefore, with regard to RMs, this alignment method is not systematically used.

Coatings obtained by direct deposition 3) from plasma have also been tested for LC alignment. The majority of these coatings are obtained by placing substrates directly in plasma discharge, as disclosed for example in J. C. Dubois, M. Gazard, and A. Zann, *Appl. Phys. Letters*, 24(7), 29738-40 (1974); R. Watanabe, T. Nakano, T. Satoh, H. Hatoh, and Y. Ohki, *Jpn. J. Appl. Phys.*, 26(3), 373 (1987), and A. I. Vangonen, and E. A. Konshina. *Mol. Cryst. Liq. Cryst.*, 304, 507 (1997). However, the resulting coatings reported in these documents are isotropic. Because of this, they cannot induce uniform tilted LC alignment without additional alignment action, which is usually rubbing.

Sprokel and Gibson in J. Electrochem. Soc., 124 (4), 557 (1977) and U.S. Pat. No. 4,261,650 describe deposition methods with a directed plasma flux under oblique incidence upon a substrate. The reactive particles carried by the gas stream condense on the substrate and form an alignment film, which provides uniform planar or homeotropic alignment depending on the type of coating formed and chemical composition of LC. The disadvantage of this method is that the particles originated from a "cold" plasma have low kinetic energy. This results in weak adhesion, low density and insufficient uniformity of the aligning films. Besides, this method is not suitable for the coating on large-area substrates.

U.S. Pat. No. 6,632,483 discloses a method of forming an amorphous film with an aligned atomic structure on a substrate, by bombarding the substrate with an ion beam generated from a carbon-containing gas. The gas is ionized in a discharge chamber to produce an ion beam comprising atoms and ions, which are then accelerated out of the ion source by applying acceleration voltages, and are directed to a substrate. The ion beam energy is 100-500 eV or higher. The film is reported to work as an alignment film in an LCD, however, no details or concrete examples of the achieved alignment are provided.

One aim of the present invention is to provide a method for aligning LCs and RMs without the need of rubbing, which provides uniform and stable alignment of the materials applied thereon, is easy to use in particular in mass production, and does not have the drawbacks of the prior art methods described above. Other aims of the present invention are immediately evident to the person skilled in the art from the following detailed description.

The inventors have found that these aims can be achieved by providing a method as claimed in this invention. In particular, this invention relates to a principally different method of plasma beam deposition, which is easy in realization and provides films of high alignment quality. It can also be extended for the deposition on large-area substrates and plastic films. In addition to their LC alignment property, these films exhibit gas barrier, chemical and mechanical protective functions.

TERMS AND DEFINITIONS

The term "particle beam" means a beam of ions, neutrals, radicals, electrons, or mixtures thereof such as plasma. Hereafter, the term particle beam will be mainly used to denote beams of accelerated ions or plasma.

The term "plasma beam" or "accelerated plasma beam" means a particle beam formed immediately in a glow discharge and pushed out of the discharge area by the electric field, usually, by the high anode potential.

The term "ion beam" is used to denote ion flux extracted from the glow discharge, commonly by the system of grids. In this case, glow discharge area and formed beam are spatially separated.

The term "particle energy" means the kinetic energy of individual particles. Depending on the particle source, particles have narrow or broad energy distribution. The particles' energy corresponding to a maximum of energy distribution will be called "predominated particles energy". In case of very narrow energy distribution each particle has an anergy equal to the predominated energy.

The term "beam of weakly (or slightly) accelerated particles/ions/plasma" means a beam of accelerated particles as defined above, having a predominated energy of 0.1-200 eV, preferably 1-100 eV, very preferably 1-50 eV.

The term "beam of moderately accelerated particles/ions/plasma" means a beam of accelerated particles as defined above having a predominated energy 100-10000 eV, preferably 100-5000 eV, very preferably 100-1000 eV.

The term "end Hall source" means a particle beam source from the family of Hall sources generating fluxes of weakly accelerated plasma with a broad distribution of particle's energy, a maximal particle energy lesser than 200 eV and a predominated energy of ⅔ of the maximal energy. This source is usually used for direct deposition and particle beam assistance in film deposition. The details of construction of this source, working principle and operation parameters can be found, for example, in U.S. Pat. No. 4,862,032.

The term "anode layer source" means a particle beam source from the family of Hall sources generating fluxes of moderately accelerated plasma with a broad distribution of particle's energy, the maximal particle energy being considerably lesser than 10,000 eV and a maximum of energy distribution, i.e., predominated particle energy, at ⅔ of the maximal energy. This source is usually used for particle beam etching and sputtering deposition. The details of construction of this source, working principle and operation parameters can be found in V. Zhurin, H. Kaufman, R. Robinson, *Plasma Sources Sci. Technol.*, 8, p. 1, 1999.

The term "reactive particles" serves to denote the particles capable to react chemically with other particles on the substrate resulting in film deposition. The gases whose plasmas produce reactive particles are called "reactive gases". Examples of these gases are hydrocarbon gases (such as $CH_4$, $C_2H_6$ or $C_2H_2$), $SiH_4$, $N_2$ and $O_2$.

The term "non-reactive particles" means particles which do not react (or poorly react) with other particles. Having sufficient acceleration, these particles cause physical etching of a substrate rather than film deposition. The gases providing non-reactice particles are referred to as "non-reactive" gases. Examples of these gases are rare gases such as Ar, Xe, Kr etc.

The terms "a-CH", "a-CHF", "a-CHN", "a-$SiO_x$" etc. mean an amorphous film or coating of hydrogenated carbon, fluorinated hydrocarbon, nitrogenated hydrocarbon, silicium oxide etc.

The terms "liquid crystal compound" or "mesogenic compound" mean a compound comprising one or more calamitic (rod- or board/lath-shaped) or discotic (disk-shaped) mesogenic groups. The term "mesogenic group" means a group with the ability to induce liquid crystalline phase (or mesophase) behaviour. The compounds comprising mesogenic groups do not necessarily have to exhibit an LC phase themselves. It is also possible that they show LC phases only in mixtures with other compounds, or when the mesogenic compounds or materials, or the mixtures thereof, are polymerised. For the sake of simplicity, the term "liquid crystal" is used hereinafter for both mesogenic and LC materials. It is understood that the temperature range of the LC phase or mesophase does not necessarily overlap with the room temperature range.

A calamitic mesogenic group is usually comprising a mesogenic core consisting of one or more aromatic or non-aromatic cyclic groups connected to each other directly or via linkage groups, optionally comprising terminal groups attached to the ends of the mesogenic core, and optionally comprising one or more lateral groups attached to the long side of the mesogenic core, wherein these terminal and lateral groups are usually selected e.g. from carbyl or hydrocarbyl groups, polar groups like halogen, nitro, hydroxy, etc., or polymerisable groups.

The term "reactive mesogen" (RM) means a polymerisable mesogenic or liquid crystal compound.

Polymerisable compounds with one polymerisable group are also referred to as "monoreactive" compounds, compounds with two polymerisable groups as "direactive" compounds, and compounds with more than two polymerisable groups as "multireactive" compounds. Compounds without a polymerisable group are also referred to as "non-reactive" compounds.

The term "thin film" means a film having a thickness in the range from several nm to several μm, in case of LCs or RMs usually in the range from 0.5 to 100 μm, preferably from 0.5 to 10 μm.

The term "film" and "layer" include rigid or flexible, self-supporting or free-standing films with mechanical stability, as well as coatings or layers on a supporting substrate or between two substrates.

The term "director" is known in prior art and means the preferred orientation direction of the long molecular axes (in case of calamitic compounds) or short molecular axes (in case of discotic compounds) of the LC or RM molecules. In films comprising uniaxially positive birefringent LC or RM material the optical axis is given by the director.

The terms "uniform orientation" or "uniform alignment" of an LC or RM material, for example in a layer of the material, mean that the long molecular axes (in case of calamitic compounds) or the short molecular axes (in case of discotic compounds) of the LC or RM molecules are oriented substantially in the same direction.

The term "homeotropic orientation/alignment", for example in a layer of an LC or RM material, means that the long molecular axes (in case of calamitic compounds) or the short molecular axes (in case of discotic compounds) of the LC or RM molecules are oriented substantially perpendicular to the plane of the layer.

The term "planar orientation/alignment", for example in a layer of an LC or RM material, means that the long molecular axes (in case of calamitic compounds) or the short molecular axes (in case of discotic compounds) of the LC or RM molecules are oriented substantially parallel to the plane of the layer.

The term "tilted orientation/alignment", for example in a layer of an LC or RM material, means that the long molecular axes (in case of calamitic compounds) or the short molecular axes (in case of discotic compounds) of the LC or RM molecules are oriented at an angle 8 ("tilt angle") between 0 and 90° relative to the plane of the layer.

The term "splayed orientation/alignment" means a tilted orientation as defined above, wherein the tilt angle varies in the direction perpendicular to the film plane, preferably from a minimum to a maximum value.

The average tilt angle $\theta_{ave}$ is defined as follows $$\theta_{ave} = \frac{\sum_{d'=0}^{d} \theta'(d')}{d}$$

wherein $\theta'(d)$ is the local tilt angle at the thickness d' within the layer, and d is the total thickness of the layer.

The tilt angle in a splayed layer hereinafter is given as the average tilt angle $\theta_{ave}$, unless stated otherwise.

The term "A plate" means an optical retarder utilizing a layer of uniaxially birefringent material with its extraordinary axis oriented parallel to the plane of the layer.

The term "C plate" means an optical retarder utilizing a layer of uniaxially birefringent material with its extraordinary axis oriented perpendicular to the plane of the layer.

The term "O plate" means an optical retarder utilizing a layer of uniaxially birefringent material with its extraordinary axis tilted at an angle to the plane of the layer.

In A- and C-plates comprising optically uniaxial birefringent liquid crystal material with uniform orientation, the optical axis of the film is given by the direction of the extraordinary axis.

An A plate or C plate comprising optically uniaxial birefringent material with positive birefringence is also referred to as "+A/C plate" or "positive A/C plate". An A plate or C plate comprising a film of optically uniaxial birefringent material with negative birefringence is also referred to as "−A/C plate" or "negative A/C plate".

In case of doubt the definitions as given in C. Tschierske, G. Pelzl and S. Diele, Angew. Chem. 2004, 116, 6340-6368 shall apply.

SUMMARY OF THE INVENTION

The invention relates to a process of preparing an alignment film on a substrate, for the alignment of liquid crystals (LCs) or reactive mesogens (RMs), comprising the step of exposing the substrate, directly or through a mask, to a beam of weakly accelerated particles having a predominated particle energy of 1-100 eV, such as ions or plasma, thereby providing a layer or film of deposited particles on the substrate (direct particle deposition).

The invention further relates to a process as described above and below, which includes one or more additional particle deposition steps for preparing one or more additional alignment films, wherein the particle beam in the further deposition step(s) is the same or different as in the first deposition step, and wherein the particle beam is directed to the substrate from the same or different directions (preferably at an oblique angle to the substrate plane) as in the first deposition step.

Optionally the process includes the step of exposing the deposited film, directly or through a mask, preferably at an oblique angle to the substrate plane, to a beam of accelerated particles having a predominated particle energy >100 eV, thereby providing anisotropic etching of the deposited film.

The invention further relates to an alignment film obtainable by a process as described above and below.

The invention further relates to the use of an alignment film as described above and below for the alignment of LCs or RMs that are applied onto said alignment film, preferably as a thin layer.

The invention further relates to a multilayer comprising an alignment film as described above and below and one or more LC and/or RM layers applied thereon, wherein the RMs are optionally polymerized.

The invention further relates to a process of preparing a multilayer as described above and below, comprising the steps of A) exposing a substrate, directly or through a mask, to a beam of weakly accelerated particles, such as ions or plasma, having a predominated particle energy of 1-100 eV, thereby forming a first alignment film by direct particle deposition (deposition step), A1) optionally exposing the deposited alignment film, directly or through a mask, to a beam of accelerated particles (ions or plasma) having a predominated energy of >100 eV, thereby providing anisotropic etching of the deposited film (surface etching step), B) applying one or more layers comprising one or more LCs and/or RMs, and optionally comprising one or more polymerizable non-mesogenic compounds, on the first alignment film prepared in step A, C) optionally polymerizing one or more of the RM(s) and/or of the polymerizable non-mesogenic compound(s) in at least one of the layers prepared in step B, D) optionally depositing a second alignment film, by a deposition step as described in step A, on the LC or RM layer(s) prepared in step B and C, D1) optionally subjecting the second alignment film to a surface etching step as described in step A1, E) optionally applying one or more layers comprising one or more LCs and/or RMs, and optionally comprising one or more polymerizable non-mesogenic compounds, on the second alignment film prepared in step D, F) optionally polymerizing one or more of the RM(s) and/or of the polymerizable non-mesogenic compound(s) in at least one of the layers prepared in step E, G) optionally depositing a top layer having antiscretching, gas barrier or antireflection function, by a deposition step as described in step A, on the multilayer prepared by steps A-F, wherein steps D-F are optionally repeated once or two or more times.

The invention further relates to the use of an alignment film or multilayer as described above and below in optical, electronic and electrooptical applications and devices.

The invention further relates to an optical, electronic or electrooptical device, or a component thereof, comprising an alignment film or multilayer as described above and below.

Said devices and components include, without limitation electrooptical displays, liquid crystal displays (LCDs), optical films, polarisers, compensators, beam splitters, reflective films, alignment films, colour filters, holographic elements, hot stamping foils, coloured images, decorative or security markings, LC pigments, adhesive layers, non-linear optic (NLO) devices, optical information storage devices, electronic devices, organic semiconductors, organic field effect transistors (OFET), integrated circuits (IC), thin film transistors (TFT), Radio Frequency Identification (RFID) tags, organic light emitting diodes (OLED), organic light emitting transistors (OLET), electroluminescent displays, organic photovoltaic (OPV) devices, organic solar cells (O-SC), organic laser diodes (O-laser), organic integrated circuits (O-IC), lighting devices, sensor devices, electrode materials, photoconductors, photodetectors, electrophotographic recording devices, capacitors, charge injection layers, Schottky diodes, planarising layers, antistatic films, conducting substrates, conducting patterns.

BRIEF DESCRIPTION OF THE DRAWINGS

FIG. 1 schematically illustrates the processes of a) surface etching, b) sputtering deposition and c) direct deposition using a particle beam.

FIGS. 3a and 3b schematically illustrate the deposition geometry applied in a process according to the present invention.

FIGS. 3c and 3d correspond to side and top view, respectively.

DETAILED DESCRIPTION OF THE INVENTION

This invention describes a new version of the direct plasma deposition process for the preparation of alignment films to overcome the problems of the prior art methods.

For example, the prior art methods of plasma generation as disclosed in Sprokel and Gibson J. Electrochem. Soc., 124 (4), 557 (1977) and U.S. Pat. No. 4,261,650, do only produce fluxes of cold r.f. (radio frequency generated) plasma, which have a particle energy of only several meV (milli eV), and are carried to the substrate by a gas stream.

In contrast, the method according to the present invention uses fluxes of slightly accelerated d.c. plasma, which have a higher predominated particle energy of 1-200, preferably 1-100 eV and are directly applied to the substrate. This allows to significantly improve the quality of the deposited films, such as increased density and adhesion to the substrates.

In addition, the direct deposition technique according to the present invention has a number of advantages compared to the alignment methods of prior art:

Compared to rubbing, it provides better microscopic uniformity of planar and homeotropic alignment, and overcomes other shortcomings of rubbing as mentioned above.

Compared to particle beam etching, it is much more effective for tilted/untilted vertical alignment of both conventional nematic LCs and RMs. Also, in addition to their LC alignment property, the films obtained by the direct deposition technique can be used as chemical protectors and gas barriers.

Compared to sputtering deposition, it is a technologically more simple process. Thus, for example a target is not needed. A low voltage operation diminishes the amount of parasitic discharges "dusting" the working area due to particle generation. The direct deposition technique provides amorphous coatings, which are commonly more uniform than in case of sputtering deposition. The particle beam formed by the plasma/ion beam source is more collimated than a particle flux sputtered from a target. This provides stronger anisotropy of the deposited films. Finally, the content of the deposited films can be continuously changed by the variation of relative content of gases forming feed gaseous mixture. This allows to vary the alignment characteristics of LC on such films.

Figure 2:
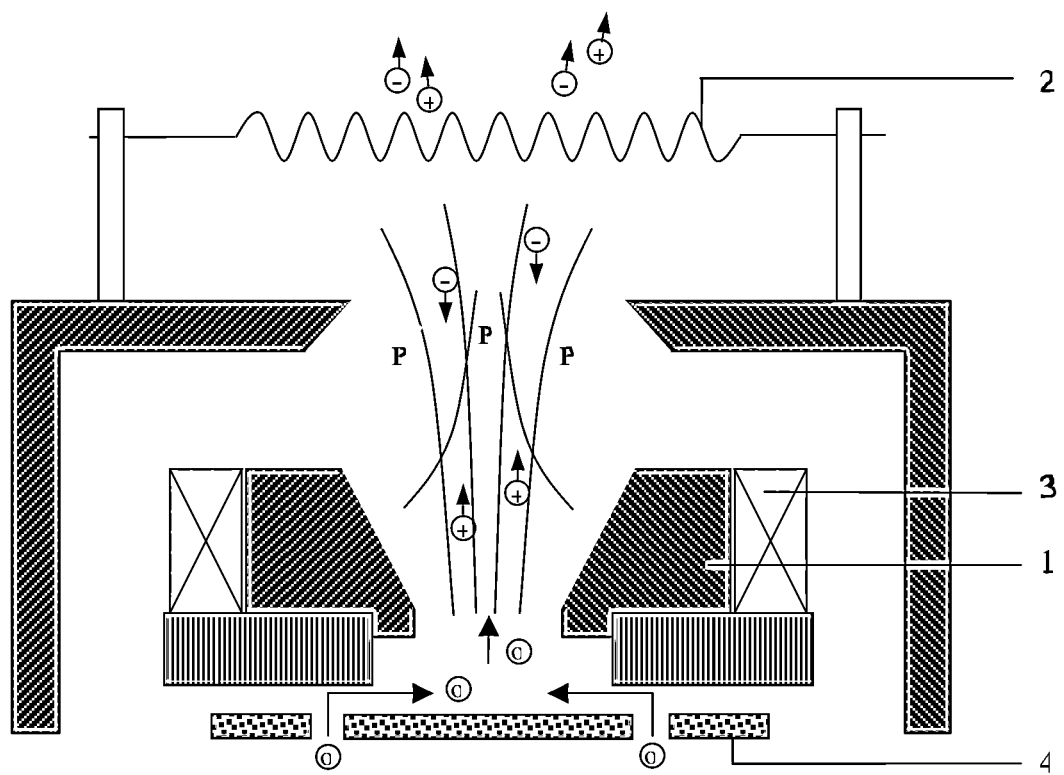
FIG. 2 exemplarily illustrates the construction and working principle of an end-Hall source used in a process according to the present invention.

To realize the direct particle beam deposition as discussed above, an ion/plasma beam source is needed that produces intensive flows of weakly accelerated reactive particles. For this purpose preferably an end-Hall source from the family of Hall sources, as disclosed for example in U.S. Pat. No. 4,862,032, is used, as schematically and exemplarily shown in FIG. 2. The source shown in FIG. 2 consists of an anode (1) beyond which a cathode (2) is spaced. On the anode is placed an electromagnet winding (3). In the scheme, neutral particles (atoms, molecules), electrons and ions are indicated, respectively, by "0", "−" and "+". Neutral particles of the working gas are introduced to the ion source through the inlet (4).

The device works as follows: Electrons emitted by the hot cathode are attracted by the anode being under a potential $U_a$. Approaching the anode, they approximately follow magnetic field lines. Accelerated electrons strike neutrals causing their ionization. Most of the ionizing collisions occur near the anode. The generated ions accelerate toward the cathode. These ions have a broad energy distribution with the maximum at $\frac{2}{3}(eU_a)$. Leaving the source, the ions involve some electrons forming a neutralized beam. Because the beam is formed immediately in the glow discharge, it can be considered as a portion of plasma extracted and accelerated by the anode potential.

The important advantage of the end-Hall source is that, further to deposition, it can also work in pre-cleaning regime. The pre-cleaning usually precedes deposition to ensure good adhesion of the produced coating to substrates.

The source is typically mounted in a vacuum chamber. The basic vacuum is $<3\times10^{-5}$ Torr. In the pre-cleaning regime, the working gas is usually argon. The working pressure $P_{Ar}$, anode potential $U_a$ and discharge current I in this regime are preferably $P_{Ar}=0.6-0.9\times10^{-3}$ Torr, $U_a=110-200$ V and I=1.0-2.0 A. In the deposition regime, a mixture of reactive gases or reactive and rare gases is used as a gas feed. The working pressure P in this regime is preferably $P=0.8-3\times10^{-3}$ Torr, while the anode potential $U_a$ and discharge current I are preferably $U_a=50-100$ V and I=1-5 A. The deposition time is typically 1-5 min, depending on the material, current and coating thickness measured by the quartz-crystal controller.

The depositions are carried out in two geometries. In the first geometry as shown in FIG. 3a, the symmetry axis of the source (1) is oriented vertically, while the substrate (2) and moving platform (3) are set slantwise with regard to the horizontal level. In the second geometry, as shown in FIG. 3b, the substrate (2) is translated with the moving platform (3) horizontally, while the source (1) is set in oblique position. The deposition angle α, which is formed by the particle beam and the film normal, is varied from 0° to 85°. The films are deposited in either static or moving regime. In the latter case, the substrate is subjected to cycling translation with a speed of 0.5 to 3 mm/s.

As substrates for example bare glass slides, glass slides coated by ITO conductive layers, polyimide films, colour filters, isotropic TAC (triacetylcellulose) films or COP (cyclic olefin polymer) plastic strips can be used.

Using the setup described above, deposition of for example a-CH, a-CHN, a-CHF, a-SiO$_x$ and a-SiO$_x$H$_y$C$_z$F$_k$ alignment films can be achieved. The processing parameters corresponding to each type of these films are summarized in Table 1.

TABLE 1

| Preparation Coating | Component of gaseous mixture/ partial pressure [Torr] | U$_a$ [V] | I [A] |
|---|---|---|---|
| a-CH | CH$_4$/1.2 10$^{-3}$; Ar/0.7 10$^{-4}$ | 70 | 2 |
| a-CHN | CH$_4$/7*10$^{-4}$, N$_2$/1.2*10$^{-3}$ | 80 | 2 |
| a-CHF | CH$_4$/1.2*10$^{-3}$, CF$_4$/0.8*10$^{-4}$ | 90 | 2 |
| a-SiO$_x$ | SiH$_4$/2 10$^{-3}$; O$_2$/3.5 10$^{-4}$ | 60 | 4 |
| a-SiO$_x$H$_y$C$_z$F$_k$ | SiH$_4$/2*10$^{-3}$, CF$_4$/7*10$^{-4}$, O$_2$/3.5 10$^{-4}$ | 80 | 4 |

Taking advantage of the end-Hall source to work in both deposition and cleaning (etching) regimes, it is also possible to realize a combination of deposition and etching processes, which often improves LC alignment and allows to prepare unique complex films of RMs or RMs and LCs. Additionally, a combination of deposition and etching is realized by using an end-Hall source as deposition and anode layer source [see H. R. Kaufman, "Technology of Closed drift thrusters". *AIAA Journal*, vol. 23, pp. 78-87 (1985)] for etching alignment processing.

Finally, the end-Hall source allows sufficient modifications compared to the conventional version used in the experiments as described herein. For example, the electro-magnet system can be replaced by permanent magnets. Also, same as the anode layer source, the end-Hall source can be arranged to form a linear version [see J. Madocks, *Proceeding of 45th Annual Technical Conference of Society of Vacuum Coaters*, Orlando, USA. p. 202 (2002)]. This allows to extend the disclosed method for the large-area substrates and to realize roll-to-roll processing of plastic strips.

The alignment film according to the present invention is suitable to provide uniform alignment of for example thermotropic nematic, cholesteric or smectic LC or RM compounds or mixtures, lyotropic LCs and RMs including chromonic LCs. The LCs or RMs are applied, preferably as a thin layer, onto an alignment film according to the present invention, or between two substrates, one or both of which carry an alignment film according to the present invention. A rubbing method is not needed.

In addition, the deposition of an alignment film on rollable plastic substrates can be realized by roll-to-roll translation. In this case the plasma beam processing is provided during roll-to-roll rewinding of a plastic strip. For example, this can be achieved by placing the roll in a vacuum chamber so that the appropriate vacuum is realised, and subsequently exposing the film to plasma deposition whilst moving the substrate from the unwind roller to the wind-up roller. This roll can then be subsequently coated with the appropriate LC or RM solution using conventional coating techniques, and the RM can subsequently be polymerized in situ for example by exposure to UV light. In this way an oriented, polymerized RM film can be prepared, and can then also be laminated to other films, for example optical films, by roll-to-roll lamination, in one continuous process.

In addition, patterned alignment (i.e. a pattern of regions with different alignment) can be realized by the use of masks and multiple deposition or deposition and etching steps.

By using the method according to the present invention, various alignment directions can be induced in the LCs or RMs, for example planar, homeotropic, tilted or splayed alignment, depending on the content of the deposited film, incidence angle of the plasma flux, plasma intensity and fluence, and the type of LCs or RMs used. Thus, it is possible to prepare LC layers or polymerized RM films having the optical properties of an A plate, a C plate or an O plate. A further detailed description how alignment can be controlled can be found in the examples, however, it should not be considered as being limited to these examples, but instead as a general description that can also be applied to other embodiments of this invention.

A further use of this technique is the alignment of a second LC or RM film on top of a first LC or RM film. This allows the production of multilayers with more complex structure, which can be used for example as optical compensators. According to the conventional methods as described in prior art, multilayer compensator structures are usually formed by lamination of separately coated layers and (optionally) delamination of the carrier substrates. In contrast, coating of one LC or RM layer directly on another one, as described in the present invention, has the advantages of removing lamination steps and also giving a much thinner product. The same method can be applied to obtain stacks of compensation and polarizing films, compensation and color filter films, etc.

As substrate for example glass or quartz sheets or plastic films can be used. Isotropic or birefringent substrates can be used. In case the substrate is not removed from the polymerised film after polymerisation, preferably isotropic substrates are used. Suitable and preferred plastic substrates are for example films of polyester such as polyethyleneterephthalate (PET) or polyethylene-naphthalate (PEN), polyether sulfone (PES), polyvinylalcohol (PVA), polycarbonate (PC) or triacetylcellulose (TAC), very preferably PET or TAC films. The substrate can also be a component of an optical, electrooptical or electronic device like an LC display, for example glass substrates containing ITO electrodes, passive or active matrix structures, silicon wafers with electronic structures used for example in LCOS devices, or colour filter layers. Substrates comprising one or more layers or films of the above-mentioned materials can also be used.

When aligning electrically addressable LCs in an electrooptic device like an LCD, the LCs are usually comprised between two aligning layers prepared as described above. The alignment directions produced by the opposite alignment layers can be antiparallel, parallel or crossed, depending on the LCD operation mode. This device can additionally contain a number of further LC or RM layers aligned according to the disclosed process.

When preparing polymer films, it is also possible to put a second substrate on top of the coated RMs prior to and/or during and/or after polymerisation. The substrates can be removed after polymerisation or not. When using two substrates in case of curing by actinic radiation, at least one substrate has to be transmissive for the actinic radiation used for the polymerisation.

The LC or RM material can be applied onto the substrate carrying the alignment film by conventional coating techniques like spin-coating or blade coating. It can also be applied to the substrate by conventional printing techniques which are known to the expert and described in the literature, like for example screen printing, offset printing, reel-to-reel printing, letter press printing, gravure printing, rotogravure printing, flexographic printing, intaglio printing, pad printing, heat-seal printing, ink-jet printing or printing by means of a stamp or printing plate.

It is also possible to dissolve the LC or RM material in a suitable solvent. This solution is then coated or printed onto the substrate carrying the alignment film, for example by spin-coating or printing or other known techniques, and the solvent is evaporated off before polymerisation. In many cases it is suitable to heat the mixture in order to facilitate the evaporation of the solvent. As solvents for example standard organic solvents can be used. The solvents can be selected for example from ketones such as acetone, methyl ethyl ketone, methyl propyl ketone or cyclohexanone; acetates such as methyl, ethyl or butyl acetate or methyl acetoacetate; alcohols such as methanol, ethanol or isopropyl alcohol; aromatic solvents such as toluene or xylene; halogenated hydrocarbons such as di- or trichloromethane; glycols or their esters such as PGMEA (propyl glycol monomethyl ether acetate), γ-butyrolactone, and the like. It is also possible to use binary, ternary or higher mixtures of the above solvents.

The method according to the present invention is also compatible with other vacuum processes employed in LCD industry, including but not limited to, ITO deposition, TFT coating, vacuum filling of LCDs for example by the one drop filling (ODF) method, etc. This can be advantageously used in an entirely vacuum technological line of LCD production, which can strongly reduce the well-known problems related to dust, humidity, air ions etc.

Especially preferred embodiments of the present invention are the following:

the substrate is isotropic,
the substrate is not rubbed,
the substrate comprises an organic or inorganic material,
the substrate is selected from glass, quartz, silicon or plastic substrates, for example plates or foils, optionally containing one or more electrode layers or other electronic structures for electrically addressing LC molecules,
the substrate is a colour filter,
the alignment film is a layer of a material selected from the group consisting of a-CH, a-CHF, a-CHN, a-SiO$_x$, a-SiO$_x$H$_y$C$_z$F$_k$,
at least a portion of, preferably the whole substrate is exposed to a particle (ion or plasma) beam from a particle (ion or plasma) beam source (deposition step), wherein the particle (ion or plasma) beam is directed at the substrate such that the symmetry axis of the source (particle beam direction) forms an angle to the normal of the substrate ("incidence angle"),
the incidence angle is from 0° to 89°, preferably from 70° to 85° (the preferred range of the incidence angle is mainly relevant for alignment films inducing planar and tilted alignment. For alignment films inducing homeotropic alignment the deposition angle is less important, but instead the content of the coating is more relevant)
the substrate is positioned at a distance of from 5 to 50 cm from the plasma beam source,
the particle or plasma beam source is a Hall source,
the particle or plasma beam source is an end-Hall source,
the particle (ion or plasma) beam in the deposition step is generated from a reactive gas or a mixture of two or more reactive gases, preferably selected from the group consisting of CH$_4$ and other hydrocarbonaceous gases, N$_2$, CF$_4$, SiH$_4$, O$_2$. The working gaseous mixture may also contain other gases such as Ar, Kr, Xe, H$_2$.
the anode potential in the deposition step is from 50 to 100 V,
the discharge current in the deposition step is from 1 to 5 A,
the working pressure in the deposition step is from $0.6 \times 10^{-3}$ to $3 \times 10^{-3}$ Torr,
the predominated particle energy in the deposition step is from 0.1 to 200 eV, preferably from 1 to 100 eV, most preferably from 1 to 50 eV,
the thickness of the alignment film, or in case of a multilayer the thickness of one or more of, preferably each of, the alignment films, prepared by the deposition step, is from 5 to 100 nm, preferably from 10 to 30 nm,
the process further comprises the step of utilizing a mask to prevent the plasma beam from reaching a predetermined portion of the substrate, for example by applying a mask to the substrate before or during plasma beam exposure,
the substrate is subjected to a cleaning step before the deposition step (pre-cleaning step), by exposing it to a particle (such as ion or plasma) beam, preferably using the same particle beam source as in the deposition step, but providing higher particle energy than in the deposition step, preferably a particle beam having a particle energy of >100 eV,
the particle beam in the pre-cleaning step is generated from a gas or a mixture of two or more gases, preferably selected from the group consisting of rare gases, such as Ar, Kr, Xe, etc.
the anode potential of the end-Hall source in the pre-cleaning step is from 100 to 200 V,
the discharge current in the pre-cleaning step is from 0.5 to 2 A, depending on particle source, hardness of substrate, etc.,
the working pressure in the pre-cleaning step is from $6 \times 10^{-4}$ to $9 \times 10^{-4}$ Torr,
the exposure time in the pre-cleaning step is from 0.5 to 5 min,
optionally, the alignment film is subjected to a plasma or ion beam etching step (surface etching step), preferably directly after the deposition step, most preferably using the same particle (such as plasma or ion) beam source as in the deposition step, preferably under the conditions as mentioned above for the pre-cleaning step (thereby the quality of planar LC or RM alignment can be improved),
very preferably the surface etching step is carried out by exposing the alignment film to a particle (such as ion or plasma) beam, preferably generated by a plasma of rare gases (Ar, Kr, Xe, etc.) having a particle energy of >100 eV, wherein the particle beam is preferably directed at the substrate such that incidence angle is from 30° to 89°, very preferably from 70° to 85°,
(it should be noted that in the process according to the present invention, an alignment film deposited by an obliquely incident particle beam is generally able to align LCs or RMs homeotropically or planarly without a post-deposition etching step as disclosed for example in WO2004/104682. Nevertheless, the planar LC or RM alignment of a deposited alignment film can further be improved if the deposited alignment film is obliquely etched. Thus, a post-deposition etching step of the alignment film is a preferred, but not necessarily required step for providing planar alignment)
the alignment induced in the LC or RM layer by said process comprises a pattern of at least two regions having different alignment direction,
the particle (ion or plasma) beam is in the form of a sheet, the process comprises the step of moving the substrate through a path of the particle (ion or plasma) beam, the alignment film is prepared by direct particle (ion or plasma) beam deposition on a continuously moving substrate, preferably a flexible plastic substrate, that is provided or unwound from a roll in a continuous or roll-to-roll process, the alignment induced in the LC or RM layer is planar alignment, the alignment induced in the LC or RM layer is homeotropic alignment, the alignment induced in the LC or RM layer is tilted or splayed alignment, the thickness of the LC or RM layer, or in case of a multilayer the thickness of one or more of, preferably each of, the single layers, is from 500 nm to 10 µm, preferably from 1 to 5 µm, the multilayer comprises two or more alignment films according to the present invention (AL) and two or more RM layers in alternating sequence (i.e. AL-RM-AL-RM), wherein the RM layers are optionally polymerized, the multilayer comprises two alignment films according to the present invention (AL) and two polymerized RM layers in alternating sequence (i.e. AL-RM-AL-RM), wherein the RM layers are planar layers, and wherein the orientation directions of the RMs in both RM layers are parallel to each other, the multilayer comprises two alignment films according to the present invention (AL) and two polymerized RM layers in alternating sequence (i.e. AL-RM-AL-RM), wherein the RM layers are planar layers, and wherein the orientation directions of the RMs in both RM layers are perpendicular to each other, the multilayer comprises two alignment films according to the present invention (AL) and two polymerized RM layers in alternating sequence (i.e. AL-RM-AL-RM), wherein the RM layers are planar layers, and wherein the orientation directions of the RMs in both RM layers are oriented at an angle from >0° to <90° relative to each other, the multilayer comprises two alignment films according to the present invention (AL) and two or more polymerized RM layers in alternating sequence (i.e. AL-RM-AL-RM), wherein one RM layer is a planar layer and another RM layer is a homeotropic layer, the multilayer comprises two alignment films according to the present invention (AL) and two or more polymerized RM layers in alternating sequence (i.e. AL-RM-AL-RM), wherein at least two RM layers are homeotropic layers, the multilayer comprises two alignment films according to the present invention (AL) and two or more polymerized RM layers in alternating sequence (i.e. AL-RM-AL-RM), wherein at least two RM layers are tilted or splayed layers, the multilayer comprises two alignment films according to the present invention (AL) and two or more polymerized RM layers in alternating sequence (i.e. AL-RM-AL-RM), wherein one RM layer is a planar layer and another RM layer is a tilted or splayed layer, the multilayer comprises two alignment films according to the present invention (AL) and two or more RM layers in alternating sequence (i.e. AL-RM-AL-RM), wherein one RM layer is a homeotropic layer and another RM layer is a tilted or splayed layer.

Hereinafter, suitable and preferred methods to study the alignment achieved in LCs and RMs by the process according to the present invention are exemplarily described, which are understood, however, only to describe but not to laminate the present invention.

LC Alignment on the Produced Coatings

The alignment of conventional liquid crystals is studied by preparing two types of sandwich LC cell:

(1) asymmetric cells in which one substrate is treated with the particle beam, while the second substrate bears a conventional rubbed polyimide layer; and (2) symmetric cells, in which both bounding plates are irradiated with the particle beam.

To obtain a uniform director orientation, the cells are assembled in an antiparallel fashion, so that the particle beam treatment directions of the two opposing bounding plates are antiparallel to each other. The cell gap is kept by spacers of diameter 15 mm. The cells are filled with nematic LC compound or mixtures with positive or negative dielectric anisotropy designed for LCDs of the TN (twisted nematic) or VA (vertically aligned) mode, respectively. The symmetric cells are used to determine the type of LC alignment (planar, tilted, homeotropic). Besides, they are used for estimation of pretil angle by crystal rotation method. The asymmetric cells are used to determine the in-plane projection of the easy axis of LC alignment.

Liquid crystal cells are examined by the naked eye on a light table between two crossed polarizers and by polarizing microscope. With vertically aligned liquid crystals, cells should always look dark when rotated. For planar cells, bright-dark alternation are observed when rotated.

On a-CHF, a-SiO$_x$ and a-SiOxCyFz coatings excellent untilted (homeotropic) and tilted vertical alignment especially of VA-LCs having negative dielectric anisotropy $\Delta\epsilon<0$ is achieved. The cells with tilted alignment demonstrate defect-free switching in an electric field.

In turn, a-CH, a-CHN and a-SiO$_x$ coatings induce uniform alignment especially in LCs having a positive dielectric anisotropy $\Delta\epsilon>0$. The LC molecules align in a direction perpendicular to the deposition plane, so that the pretilt angle is intrinsically equal to zero. However, by combination of two depositions in mutually perpendicular directions, low-pretilt alignment of these LCs is realized. These cells demonstrate excellent electro-optic switching with the T-V curve identical to that for the cells based on rubbed polyimide layers.

RM Alignment on the Produced Coatings

The alignment of RMs is tested by depositing RM films on the isotropic alignment substrates and observation of these samples between crossed polarizers on a light box and in a polarizing microscope. The retardation properties of the RM films are studied by null ellipsometry technique [see O. Yaroshchuk et al., J. Chem. Phys., 114 (12), 5330 (2001)]. The optical scheme of this method consists of a probe beam, a fixed polarizer, a quarter wave plate with the optic axis parallel to the axis of polarizer, and a rotating analyzer. The sample is placed between polarizer and retardation plate. The probe beam (628 nm) is linearly polarized at 45° with respect to the in-plane main axis of the anisotropic sample. The elliptically polarized beam transmitted by the anisotropic sample is converted into a linearly polarized beam by a quarter wave plate. The angle θ of the output polarization, determined by rotation of a linear analyzer, gives the in-plane retardation (ny−nx)d (wherein x, y and z are the principle axes of the sample as shown in FIGS. 3c and 3d)

Figure 3C:
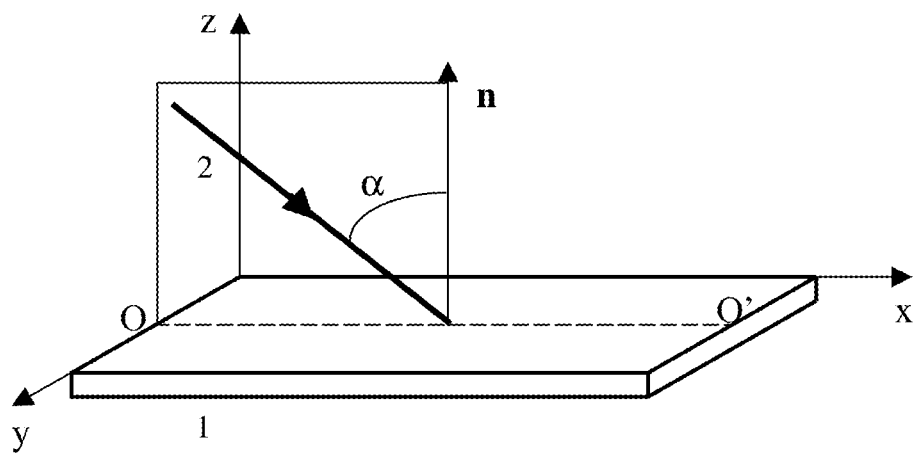
FIGS. 3c and 3d schematically illustrate substrate and its alignment during particle beam exposure. x, y and z are principal axes of the substrate, 1 is substrate, 2 is a particle beam, OO' is a projection of particle beam on the substrate.
Figure 3D:
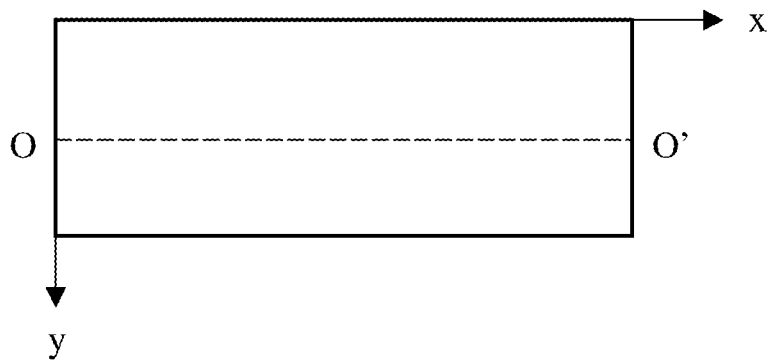

FIGS. 3c and 3d schematically illustrate a substrate and its alignment during particle beam exposure. Therein, 1 is the substrate, x, y and z are the principal axes of the substrate, 2 is the particle beam, OO' is the projection of the particle beam on the substrate. FIGS. 3c and 3d corresponds to the side and the top view, respectively.

Then the sample is rotated around the x and y axis vertically aligned and the polarization angle φ is measured as a function of the incidence angle θ. The out-of-plane retardation (nz−nx)d is determined by fitting a theoretical expression of φ(θ). This method yields the in-plane and out-of-plane film retardation as well as the spatial orientation of the optical axis.

Using the coatings enumerated above, uniform homeotropic, tilted and planar alignment of RM films is achieved, wherein demonstrating the optical retardation of positive C, positive O and positive A plates. Alignment patterning of these films is also possible. Moreover, the disclosed alignment deposition technique simplifies the preparation of multilayered compensation films. The alignment film deposited on the RM film protects it from the partial solution during deposition of subsequent RM film. An additional function of the alignment coatings is a gas barrier function that is especially important in case of plastic LCDs. Finally, the coating method according to the present invention can be successfully used for deposition of antiscratching and antireflective coatings.

In addition to the opportunities above, the alignment method of direct deposition according to the present invention can be effectively combined with the etching alignment method disclosed for example in PCT/EP/2007/007078 for the further improvement of LC alignment and preparation of complex LC structures.

The method according to the present invention is not limited to specific LC or RM materials, but can in principle be used for alignment of all LCs or RMs known from prior art. The LCs and RMs are preferably selected from calamitic or discotic compounds demonstrating thermotropic or lyotropic liquid crystallinity, very preferably calamitic compounds, or mixtures of one or more types of these compounds having LC mesophases in a certain temperature range. These materials typically have good optical properties, like reduced chromaticity, and can be easily and quickly aligned into the desired orientation, which is especially important for the industrial production of polymer films at large scale. The LCs and RMs may contain dichroic dyes or further components or additives. The LCs can be small molecules (i.e. monomeric compounds) or LC oligomers or LC polymers.

Especially preferred are LCs or RMs, or mixtures comprising one or more LC or RM compounds, which have thermotropic nematic, smectic or cholesteric mesophases.

Preferably the LC material is a mixture of two or more, for example 2 to 25 LC compounds. The LC compounds are typically low molecular weight LC compounds selected from nematic or nematogenic substances, for example from the known classes of the azoxybenzenes, benzylidene-anilines, biphenyls, terphenyls, phenyl or cyclohexyl benzoates, phenyl or cyclohexyl esters of cyclohehexanecarboxylic acid, phenyl or cyclohexyl esters of cyclohexylbenzoic acid, phenyl or cyclohexyl esters of cyclohexylcyclohexanecarboxylic acid, cyclohexylphenyl esters of benzoic acid, of cyclohexanecarboxylic acid and of cyclo-hexylcyclohexanecarboxylic acid, phenylcyclohexanes, cyclohexyl-biphenyls, phenyl-cyclohexylcyclohexanes, cyclohexylcyclohexanes, cyclohexylcyclohexenes, cyclohexylcyclohexylcyclohexenes, 1,4-bis-cyclohexylbenzenes, 4,4'-bis-cyclohexylbiphenyls, phenyl- or cyclo-hexylpyrimidines, phenyl- or cyclo-hexylpyridines, phenyl- or cyclo-hexylpyridazines, phenyl- or cyclohexyldioxanes, phenyl- or cyclo-hexyl-1,3-dithianes, 1,2-diphenyl-ethanes, 1,2-dicyclohexylethanes, 1-phenyl-2-cyclohexylethanes, 1-cyclohexyl-2-(4-phenylcyclohexyl)-ethanes, 1-cyclohexyl-2-biphenyl-ethanes, 1-phenyl2-cyclohexyl-phenylethanes, optionally halogenated stilbenes, benzyl phenyl ether, tolanes, substituted cinnamic acids and further classes of nematic or nematogenic substances. The 1,4-phenylene groups in these compounds may also be laterally mono- or difluorinated. The LC mixture is preferably based on achiral compounds of this type.

The most important compounds that can be used as components of the LC mixture can be characterized by the following formula

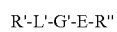

wherein L' and E, which may be identical or different, are in each case, independently from one another, a bivalent radical from the group formed by -Phe-, -Cyc-, -Phe-Phe-, -Phe-Phe-Phe-, -Phe-Cyc-, -Cyc-Cyc-, -Pyr-, -Dio-, -Pan-, -B-Phe-, -B-Phe-Phe- and -B-Cyc- and their mirror images, where Phe is unsubstituted or fluorine-substituted 1,4-phenylene, Cyc is trans-1,4-cyclohexylene or 1,4-cyclohexenylene, Pyr is pyrimidine-2,5-diyl or pyridine-2,5-diyl, Dio is 1,3-dioxane-2,5-diyl, Pan is pyrane-2,5-diyl and B is 2-(trans-1,4-cyclohexyl) ethyl, pyrimidine-2,5-diyl, pyridine-2,5-diyl, 1,3-dioxane-2,5-diyl, or pyrane-2,5-diyl.

G' in these compounds is selected from the following bivalent groups or their mirror images:
—CH═CH—, —CH═CY—, —CY═CY—, —C≡C—, —CH$_2$—CH$_2$—, —CF$_2$O—, —CH$_2$—O—, —CH$_2$—S—, —CO—O—, —CO—S— or a single bond, with Y being halogen, preferably F, or —CN.

R' and R" are, in each case, independently of one another, alkyl, alkenyl, alkoxy, alkenyloxy, alkanoyloxy, alkoxycarbonyl or alkoxycarbonyloxy with 1 to 18, preferably 3 to 12 C atoms, or alternatively one of R' and R" is F, CF$_3$, OCF$_3$, Cl, NCS or CN.

In most of these compounds R' and R" are, in each case, independently of each another, alkyl, alkenyl or alkoxy with different chain length, wherein the sum of C atoms in nematic media generally is between 2 and 9, preferably between 2 and 7.

Many of these compounds or mixtures thereof are commercially available. All of these compounds are either known or can be prepared by methods which are known per se, as described in the literature (for example in the standard works such as Houben-Weyl, Methoden der Organischen Chemie [Methods of Organic Chemistry], Georg-Thieme-Verlag, Stuttgart), to be precise under reaction conditions which are known and suitable for said reactions. Use may also be made here of variants which are known per se, but are not mentioned here.

Suitable RMs are known to the skilled person and are disclosed for example in WO 93/22397, EP 0 261 712, DE 195 04 224, WO 95/22586, WO 97/00600, U.S. Pat. No. 5,518,652, U.S. Pat. No. 5,750,051, U.S. Pat. No. 5,770,107 and U.S. Pat. No. 6,514,578. Examples of suitable and preferred monoreactive, direactive and chiral RMs are shown in the following list.

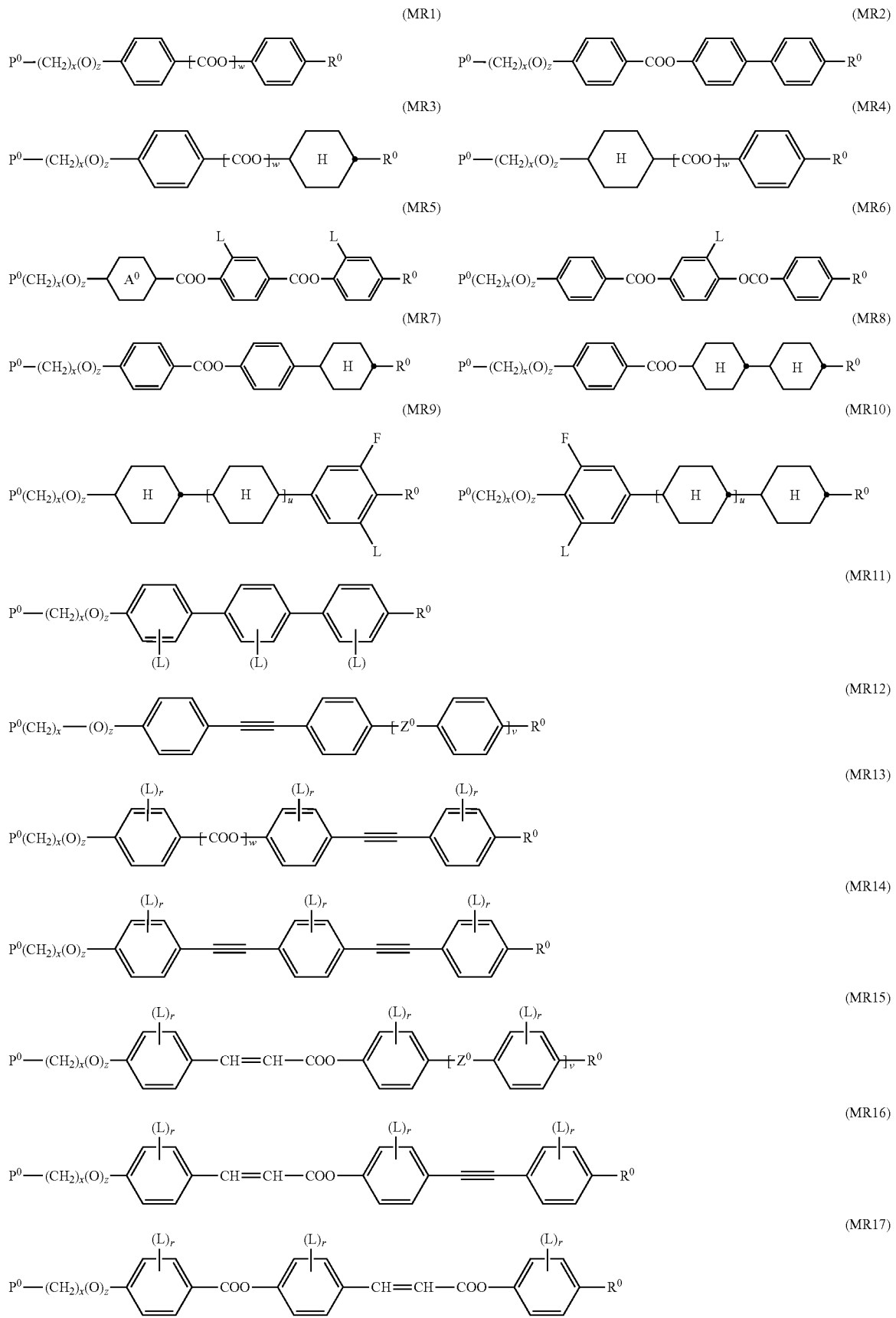

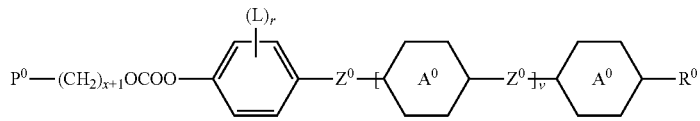
(MR18)
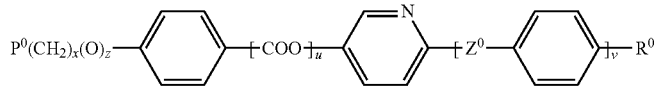
(MR19)
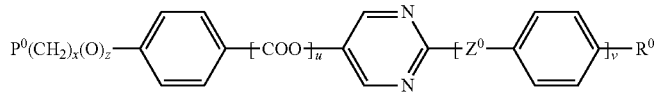
(MR20)
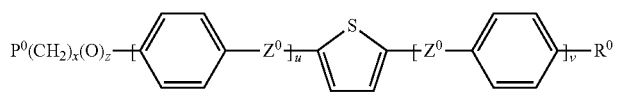
(MR21)
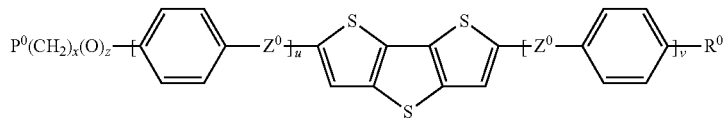
(MR22)
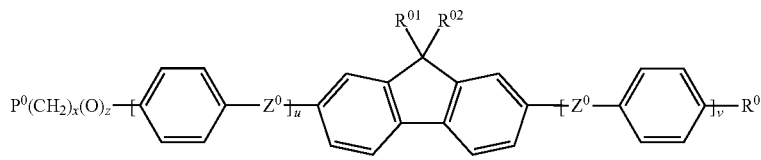
(MR23)
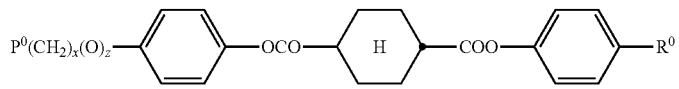
(MR24)
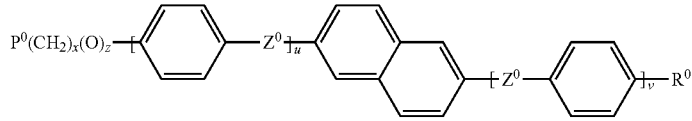
(MR25)
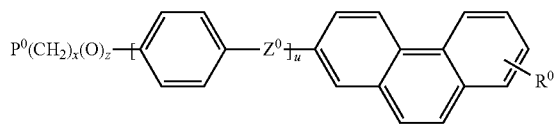
(MR26)
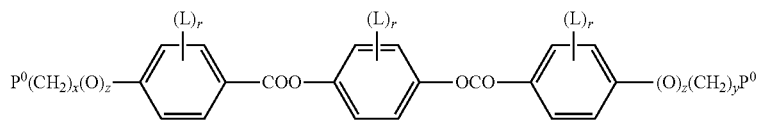
(DR1)
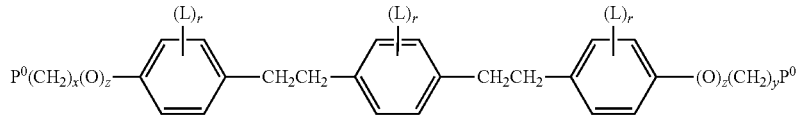
(DR2)
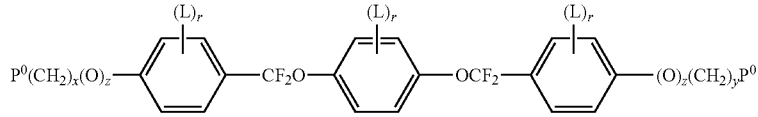
(DR3)

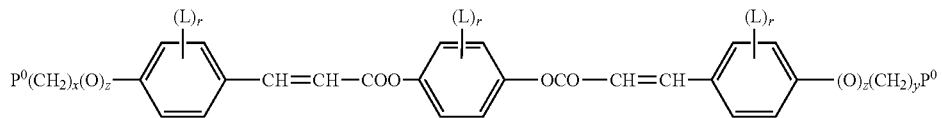
(DR4)
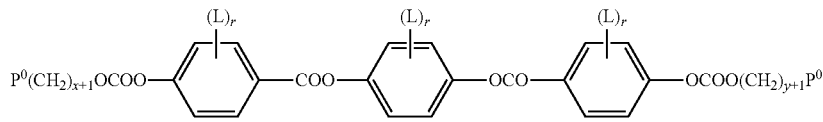
(DR5)
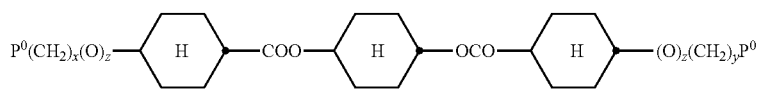
(DR6)
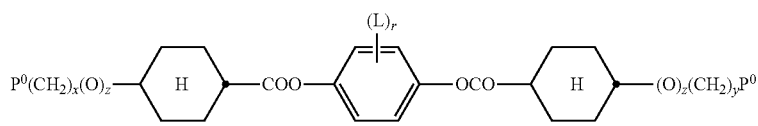
(DR7)
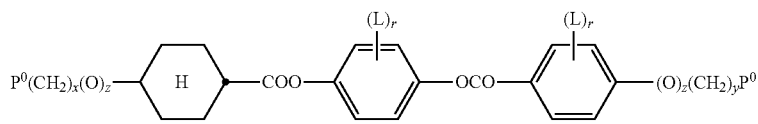
(DR8)
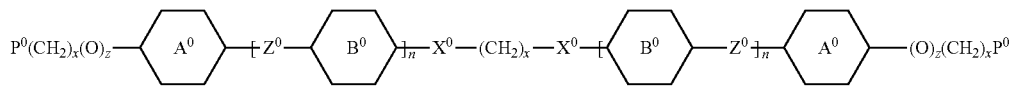
(DR9)
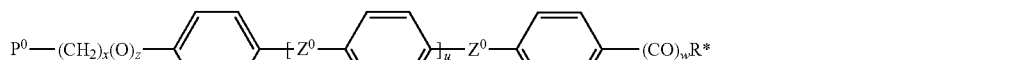
(CR1)
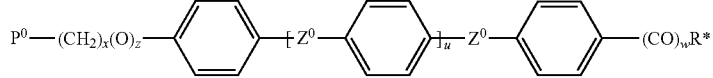
(CR2)
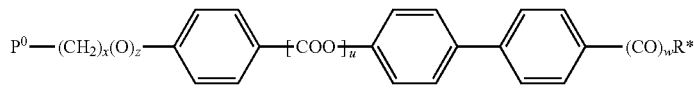
(CR3)
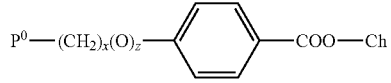
(CR4)
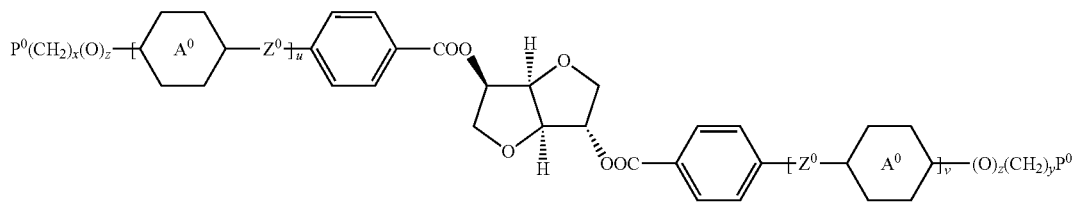
(CR5)
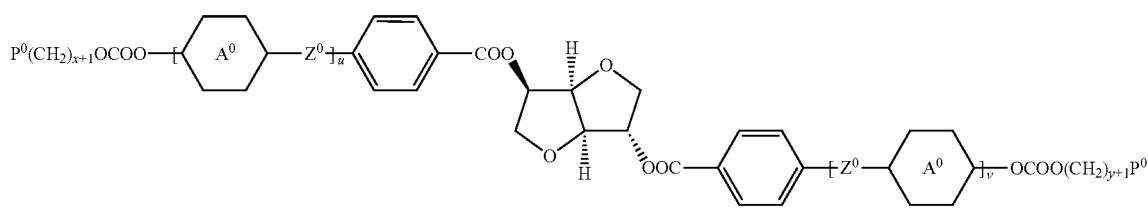

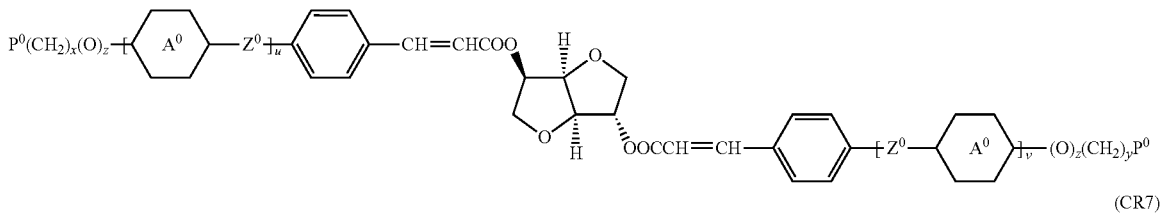

(CR6)

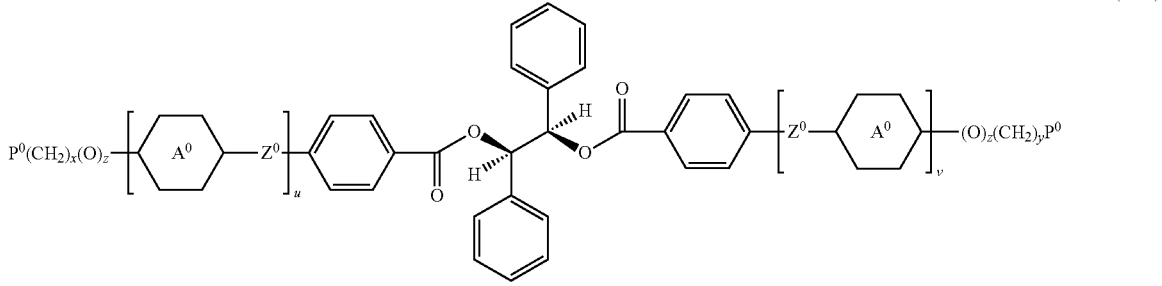

(CR7)

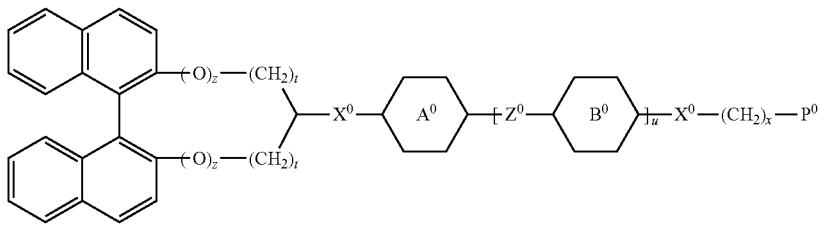

(CR8)

wherein
P⁰ is, in case of multiple occurrence independently of one another, a polymerisable group, preferably an acryl, methacryl, oxetane, epoxy, vinyl, vinyloxy, propenyl ether or styrene group,
A⁰ and B⁰ are, in case of multiple occurrence independently of one another, 1,4-phenylene that is optionally substituted with 1, 2, 3 or 4 groups L, or trans-1,4-cyclohexylene,
Z⁰ is, in case of multiple occurrence independently of one another, —COO—, —COO—, —CH₂CH₂—, —C≡C—, —CH═CH—, —CH═CH—COO—, —OCO—CH═CH— or a single bond,
R⁰ is alkyl, alkoxy, thioalkyl, alkylcarbonyl, alkoxycarbonyl, alkylcarbonyloxy or alkoxycarbonyloxy with 1 or more, preferably 1 to 15 C atoms which is optionally fluorinated, or is Y⁰ or P—(CH₂)ᵧ—(O)_z—,
Y⁰ is F, Cl, CN, NO₂, OCH₃, OCN, SCN, SF₅, optionally fluorinated alkylcarbonyl, alkoxycarbonyl, alkylcarbonyloxy or alkoxycarbonyloxy with 1 to 4 C atoms, or mono- oligo- or polyfluorinated alkyl or alkoxy with 1 to 4 C atoms,
R⁰¹,⁰² are independently of each other H, R⁰ or Y⁰,
R* is a chiral alkyl or alkoxy group with 4 or more, preferably 4 to 12 C atoms, like 2-methylbutyl, 2-methyloctyl, 2-methylbutoxy or 2-methyloctoxy,
Ch is a chiral group selected from cholesteryl, estradiol, or terpenoid radicals like menthyl or citronellyl,
L is, in case of multiple occurrence independently of one another, H, F, Cl, CN or optionally halogenated alkyl, alkoxy, alkylcarbonyl, alkoxycarbonyl, alkylcarbonyloxy or alkoxycarbonyloxy with 1 to 5 C atoms,
r is 0, 1, 2, 3 or 4,
t is, in case of multiple occurrence independently of one another, 0, 1, 2 or 3,
u and v are independently of each other 0, 1 or 2,
w is 0 or 1,
x and y are independently of each other 0 or identical or different integers from 1 to 12,
z is 0 or 1, with z being 0 if the adjacent x or y is 0,
and wherein the benzene and napthalene rings can additionally be substituted with one or more identical or different groups L.

The general preparation of polymerised LC or RM films is known to the ordinary expert and described in the literature, for example in D. J. Broer; G. Challa; G. N. Mol, *Macromol. Chem.*, 1991, 192, 59. Typically a polymerisable LC or RM material is coated or otherwise applied onto a substrate where it aligns into uniform orientation, and polymerised in situ in its LC phase at a selected temperature for example by exposure to heat or actinic radiation, preferably by photo-polymerisation, very preferably by UV-photopolymerisation, to fix the alignment of the LC or RM molecules. If necessary, uniform alignment can be further promoted by additional means like shearing or annealing the LC or RM material, surface treatment of the substrate, or adding surfactants to the LC or RM material.

Polymerisation is achieved for example by exposing the polymerisable material to heat or actinic radiation. Actinic radiation means irradiation with light, like UV light, IR light or visible light, irradiation with X-rays or gamma rays or irradiation with high energy particles, such as ions or electrons. Preferably polymerisation is carried out by UV irradiation. As a source for actinic radiation for example a single UV lamp or a set of UV lamps can be used. When using a high lamp power the curing time can be reduced. Another possible source for actinic radiation is a laser, like for example a UV, IR or visible laser.

Polymerisation is preferably carried out in the presence of an initiator absorbing at the wavelength of the actinic radiation. For this purpose the polymerisable LC material preferably comprises one or more initiators, preferably in a concentration from 0.01 to 10%, very preferably from 0.05 to 5%. For example, when polymerising by means of UV light, a photoinitiator can be used that decomposes under UV irradiation to produce free radicals or ions that start the polymerisation reaction. For polymerising acrylate or methacrylate groups preferably a radical photoinitiator is used. For polymerising vinyl, epoxide or oxetane groups preferably a cationic photoinitiator is used. It is also possible to use a thermal polymerisation initiator that decomposes when heated to produce free radicals or ions that start the polymerisation. Typical radical photoinitiators are for example the commercially available Irgacure® or Darocure® (Ciba Geigy AG, Basel, Switzerland). A typical cationic photoinitiator is for example UVI 6974 (Union Carbide).

The LC or RM material can additionally comprise one or more additives like for example catalysts, sensitizers, stabilizers, inhibitors, chain-transfer agents, co-reacting monomers, surface-active compounds, lubricating agents, wetting agents, dispersing agents, hydrophobing agents, adhesive agents, flow improvers, defoaming agents, deaerators, diluents, reactive diluents, auxiliaries, colourants, dyes, pigments or nanoparticles.

The oriented LC or RM layers and polymer films of the present invention can be used as retardation or compensation film for example in LCDs to improve the contrast and brightness at large viewing angles and reduce the chromaticity. They can be used outside the switchable LC cell in an LCD, or between the substrates, usually glass substrates, forming the switchable LC cell and containing the switchable LC medium (incell application).

The polymer films of the present invention can also be used as alignment film for other LC or RM materials. For example, they can be used in an LCD to induce or improve alignment of the switchable LC medium, or to align a subsequent layer of polymerisable LC material coated thereon. In this way, stacks of polymerised LC films can be prepared.

The oriented LC or RM layers and polymer films of the present invention can be used in conventional LC displays, for example displays with vertical alignment like the DAP (deformation of aligned phases), ECB (electrically controlled birefringence), CSH (colour super homeotropic), VA (vertically aligned), VAN or VAC (vertically aligned nematic or cholesteric), MVA (multi-domain vertically aligned) or PVA (patterned vertically aligned) mode; displays with bend or hybrid alignment like the OCB (optically compensated bend cell or optically compensated birefringence), R-OCB (reflective OCB), HAN (hybrid aligned nematic) or pi-cell ($\pi$-cell) mode; displays with twisted alignment like the TN (twisted nematic), HTN (highly twisted nematic), STN (super twisted nematic), AMD-TN (active matrix driven TN) mode; displays of the IPS (in plane switching) mode, or displays with switching in an optically isotropic phase.

The present invention is described above and below with particular reference to the preferred embodiments. It should be understood that various changes and modifications may be made therein without departing from the spirit and scope of the invention. In particular, direct particle beam deposition can be realized by using other particle beam sources. For instance, according to [V. Dudnikov and A. Westner, "Ion source with closed drift anode layer plasma acceleration". *Review of Scientific Instruments*, 73 (2), 729 (2002)], an anode layer source can operate in direct deposition mode. The one by one deposition of the alignment multilayers described above can be substituted by simultaneous deposition from more than one particle beam. In addition to particle beams providing direct deposition, some of these beams can be produced by sputtering of various targets. The proposed combination of deposition and etching regimes can be modified so that they will occur simultaneously.

The alignment films used for illustration in the examples below do not limit the variety of films which can be deposited by the direct deposition method and used for the alignment purpose. Other possible examples for particle beams are $SiN_x$, $Si_xO_yN_z$, $Si_xO_yF_z$, $Si_xC_yH_zF_k$, $C_xH_yN_zF_k$ and many others.

The substrates used for deposition of alignment coatings are not limited to those sorts used in the preferred embodiments described above. For example, crystal plates, metallic foils, isotropic and anisotropic strips of various polymers can be used for this purpose.

The conventional LCs utilized are known to the art. Preferably they are nematic LC. Alternatively, ferroelectric LCs exhibiting a chiral smectic C* phase or cholesteric LCs can be utilized. Further to RMs, the proposed technique can also be used for alignment of other types of "passive" LCs, such as lyotropic LCs or LCs being in an undercooled state at ambient temperature.

The invention will be better understood by reference to the following examples, which serve to illustrate the invention without restricting it. The examples are divided into three groups: The first group (Examples 1.1-1.7) demonstrates the capabilities of the technique according to the present invention to align conventional LCs. The second group (Examples 2.1-2.13) illustrates the alignment of RMs and retardation properties of corresponding films. The third group (Examples 3.1 and 3.2) considers the combination of direct deposition and etching processes of particle beam alignment.

Example 1

1. Alignment of Conventional Nematic LCs

Example 1.1

An a-CH coating is produced on a glass substrate in the following way: A glass/ITO slide with the size of 2×2 cm$^2$ pre-cleaned with acetone and isopropanol is set obliquely on a moving platform in a vacuum chamber beneath the end-Hall source with the ITO layer facing the source (as shown in FIG. 3a). The moving speed of platform is 2 mm/s. The angle between the symmetry axis of the source (particle beam direction) and the normal of the substrate, defined as the beam incidence angle $\alpha$, is 85° (see FIG. 3c). The chamber is pumped out to the basic vacuum $2*10^{-5}$ Torr. In the following, the chamber is filled with Ar, a beam of Ar plasma is generated and used to pre-clean the substrates. The pre-cleaning parameters are as follows: argon pressure $7*10^{-4}$ Torr, anode potential $U_a$=110 V, discharge current I=1 A, processing time 5 min. After that a mixture of $CH_4$ and Ar gases is supplied in the chamber and oblique deposition of a-CH film with a thickness of 15 nm is realized. The deposition parameters are as follows: partial pressure of methane $P_{CH4}$=$1.2*10^{-3}$ Torr, partial pressure of argon $P_{Ar}$=$0.7*10^{-4}$ Torr, anode potential 70 V, discharge current I=2 A.

The substrate prepared by this method is used as a test substrate for an asymmetric LC cell. The second substrate (reference substrate) is a 2×3 cm$^2$ glass/ITO slide coated by a layer of polyimide (PI) SE410 (commercially available from Nissan Chemical Industries Ltd.) and subsequently rubbed. The cell is assembled from these two substrates so that the rubbing and deposition directions are antiparallel. The cell gap is maintained with 15 μm spacers. The substrates are pressed and glued with an epoxy glue. The nematic LC mixture (commercially available from Merck Taiwan) ZLI-2293 is filled into the cell.

Figure 4:
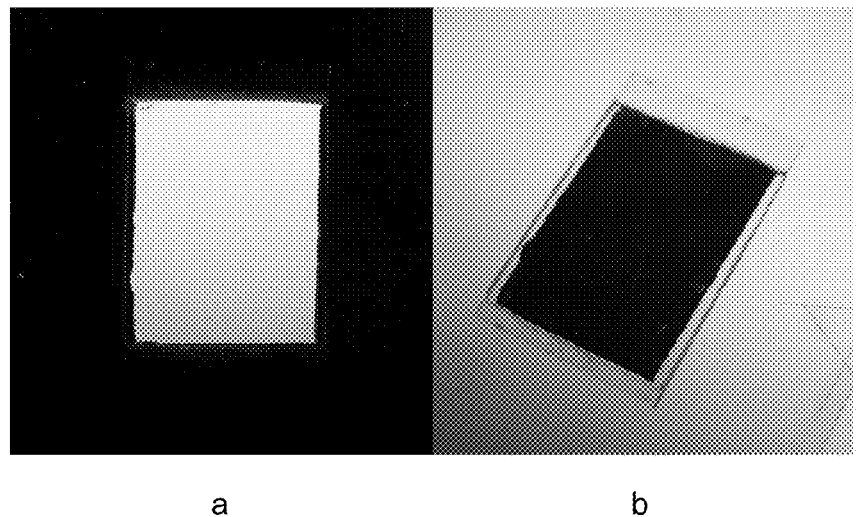
FIG. 4 shows photographs of an LC cell containing a planarly aligned LC mixture between a rubbed substrate and a substrate comprising an alignment film according to example 1.1, viewed between a pair of (a) crossed and (b) parallel polarizers.

FIG. 4 shows pictures of this cell viewed between a pair of a) crossed and b) parallel polarizers. It is evident that the LC mixture exhibits highly uniform planar alignment. The 90° twist director configuration in the cell means that LC mixture on the deposited a-CH film is aligned perpendicularly to the deposition plane. In this alignment mode, the pretilt angle of the LC mixture is intrinsically equal to zero.

Example 1.2

An a-CHF coating is produced on a glass substrate in a way similar to Example 1.1. The components of the working gaseous mixture are $CH_4$ and $CF_4$. The parameters of deposition are as follows: $P_{CH4}=1.2*10^{-3}$ Torr, $P_{CF4}=0.8*10^{-4}$ Torr, $U_a=90$ V, I=2 A, α=85°. The thicknesses of the obtained a-CHF coating is 15 nm. This substrate is combined with the reference glass substrate with a rubbed PI layer to prepare an asymmetric cell as described in Example 1.1. In this cell, the nematic LC mixture ZLI-2293 shows excellent alignment with the easy alignment axis on the tested a-CHF film oriented perpendicular to the plane of deposition.

Example 1.3

An a-$SiO_x$ coating is produced on a glass substrate in a way similar to Example 1.1. The components of the working gaseous mixture are $SiH_4$ and $O_2$. The parameters of deposition are as follows: $P_{SiH4}=2*10^{-3}$ Torr, $P_{O2}=3.5*10^{-4}$ Torr, $U_a=60$ V, I=2 A, α=85°. The thickness of the obtained a-SiOx coating is 15 nm. This substrate is combined with the reference glass substrate with rubbed PI layer to prepare an asymmetric cell as described in Example 1.1. The nematic LC mixture E7 (commercially available from Merck KGaA, Darmstadt, Germany) is filled into this cell. The LC mixture shows excellent alignment with the easy alignment axis on the tested a-SiOx film oriented perpendicular to the plane of deposition.

Figure 5:
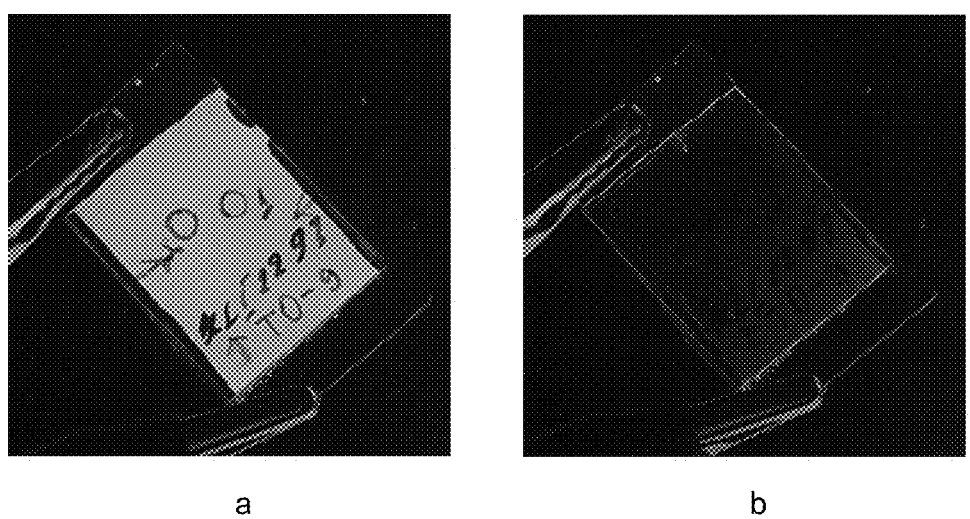
FIG. 5 shows photographs of an LC cell containing a planarly aligned LC mixture between two conducting substrates comprising an alignment film according to example 1.4, viewed between a pair of crossed polarizers, in a state (a) without an electric field and (b) with an electric field applied.

Example 1.4 a-CH coatings on a glass/ITO slide are prepared as in example 1.1, except that the first a-CH coating is overcoated with a second a-CH coating, so that the projections of the first and the second particle beams on the substrate are perpendicular. The deposition parameters in the second deposition step are the same as in the first one: $P_{CH4}=1.2*10^{-3}$ Torr, $P_{Ar}=0.7*10^{-4}$ Torr, $U_a=70$ V, I=2 A and a=85°. The thickness of the second a-CH layer is 1 nm. The substrates thereby obtained are used to prepare a symmetric LC cell. The substrates are assembled in such a manner that the directions of second depositions are antiparallel. The cell with a gap of 15 μm is glued with an epoxy glue and filled with the nematic LC mixture ZLI-2293. FIG. 5 shows pictures of this cell viewed between a pair of crossed polarizers a) in the field off state and b) when an electric field of 10V, 1 kHz is applied to the ITO electrodes. This demonstrates the excellent planar alignment in the cell obtained. The pretilt angle in this cell estimated by crystal rotation method is about 1°. In FIG. 5 it can also be seen that the cell demonstrates a defect-free switching in the electric field.

Example 1.5

Double a-CHF coatings are produced on a glass substrate as a result of a sequence of two mutually perpendicular depositions as described in Example 1.4. In contrast to Example 1.4, the components of the working gaseous mixture are $CH_4$ and $CF_4$. The parameters of deposition are as follows: $P_{CF4}=1.2*10^{-3}$ Torr, $P_{CF4}=0.8*10^{-4}$ Torr, $U_a=90$ V, I=2 A, α=85°. The thicknesses of the first and the second a-CHF coating are 15 nm and 1 nm. Using these substrates, a symmetric antiparallel LC cell is prepared as described in Example 1.4. The quality of the planar alignment of ZLI-2293 in the cell is as high as in FIG. 5. The pretilt angle of ZLI-2293 is about 2.4°. The cell demonstrates defect-free switching in the electric field.

Example 1.6

Double a-SiOx coatings are produced on a glass substrate as a result of a sequence of two mutually perpendicular depositions as described in Example 1.4. In contrast to Example 1.4, the components of the working gaseous mixture are $SiH_4$ and $O_2$. The parameters of deposition are as follows: $P_{SiH4}=2*10^{-3}$ Torr, $P_{O2}=3.5*10^{-4}$ Torr, $U_a=60$ V, I=2 A, α=85°. The thicknesses of the first and the second a-$SiO_x$ coatings are 15 nm and 1 nm. Using these substrates, a symmetric antiparallel LC cell is prepared as described in Example 1.4. The planar alignment quality of E7 in the cell is as high as in FIG. 5. The pretilt angle of LC E7 is 1.2°. The cell demonstrates defect-free switching in the electric field.

Example 1.7

Figure 6:
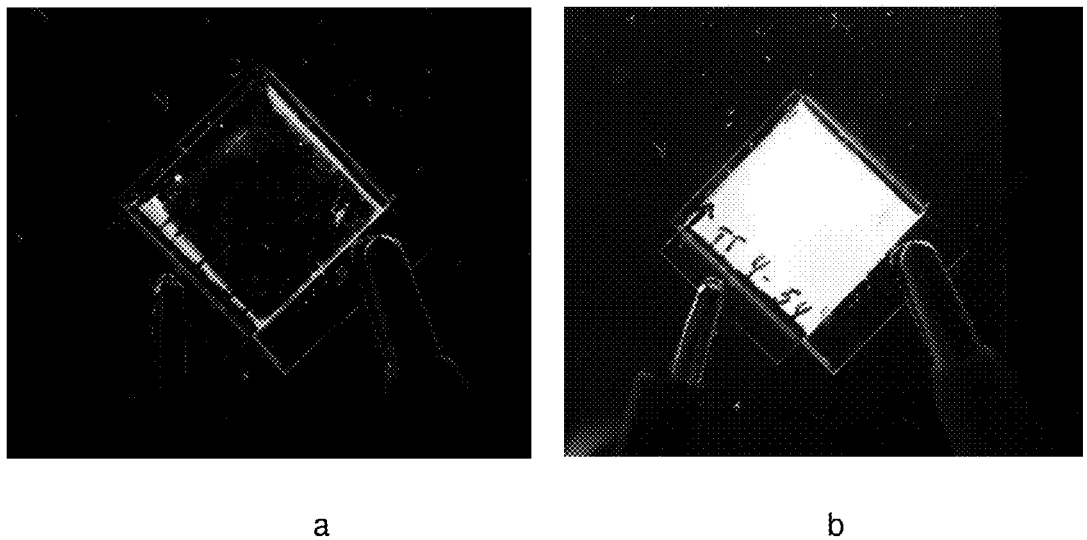
FIG. 6 shows photographs of an LC cell containing a homeotropically aligned LC mixture between two conducting substrates comprising an alignment film according to example 1.7, viewed between a pair of crossed polarizers, in a state (a) without an electric field and (b) with an electric field applied.

An a-CHF coating on 2×3 $cm^2$ glass/ITO slides is produced as in Example 1.2. Using these substrates a symmetric cell is prepared so that the deposition directions on the opposite substrates are antiparallel. The cell is 7 μm thick. It is filled with the nematic LC mixtures MJ961180 (commercially available from Merck Japan Ltd.). The pretilt angle of this LC mixture in the cell estimated by crystal rotation method is 89.2°. The cell demonstrates defect-free switching in the electric field, as can be seen in FIG. 6, which shows pictures of this cell viewed between a pair of crossed polarizers a) in the field off state and b) when an electric field of 10V, 1 kHz is applied to the ITO electrodes. This demonstrates the excellent homeotropic alignment in the cell obtained.

2. Alignment of RMs

Example 2.1

Several a-CH coatings are deposited on 2×3 $cm^2$ glass slides as in Example 1.1. The reactive mesogen mixtures RMM256C, RMM141 (both designed for planar alignment), RMM19B (designed for tilted alignment), and RMM007 and RMM77 (designed for homeotropic alignment), all of which are commercially available from Merck KGaA, Darmstadt, Germany, are dissolved in toluene at a concentration of 35 wt. %. The filtered solution of each RMM is spin coated on the a-CH film (3000 rpm, 30 s). Immediately after deposition the films are placed on a hot stage at 50° C. for 45 s and after that subjected to UV irradiation from the high pressure mercury lamp (100 mW/$cm^2$, 1 min). As a result a polymerized RM film is obtained.

Figure 7:
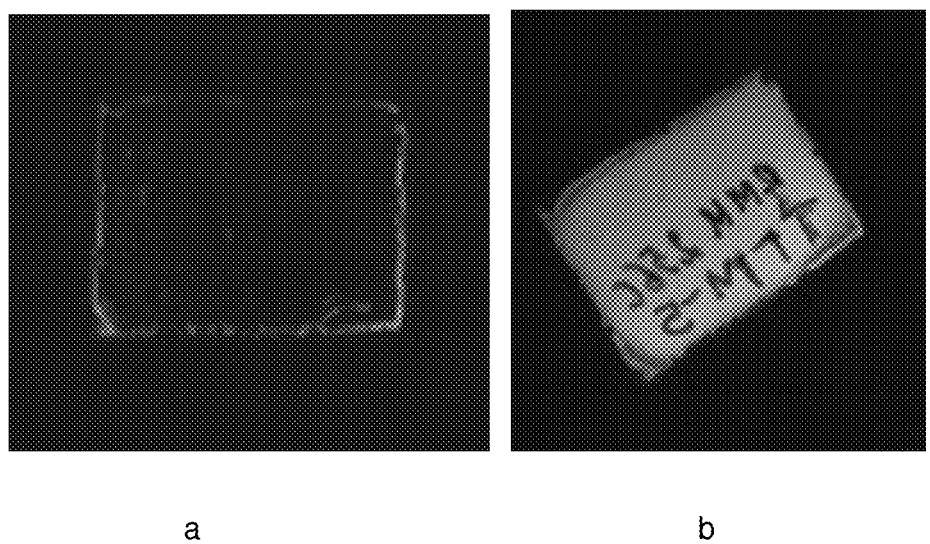
FIG. 7 shows photographs of a polymerized RM film with planar alignment prepared on an alignment film according to example 2.1, viewed between a pair of crossed polarizers, where the alignment axis (y axis, see FIG. 3c) is oriented at an angle of (a) 0° and (b) 45° towards one polarizer.
Figure 8:
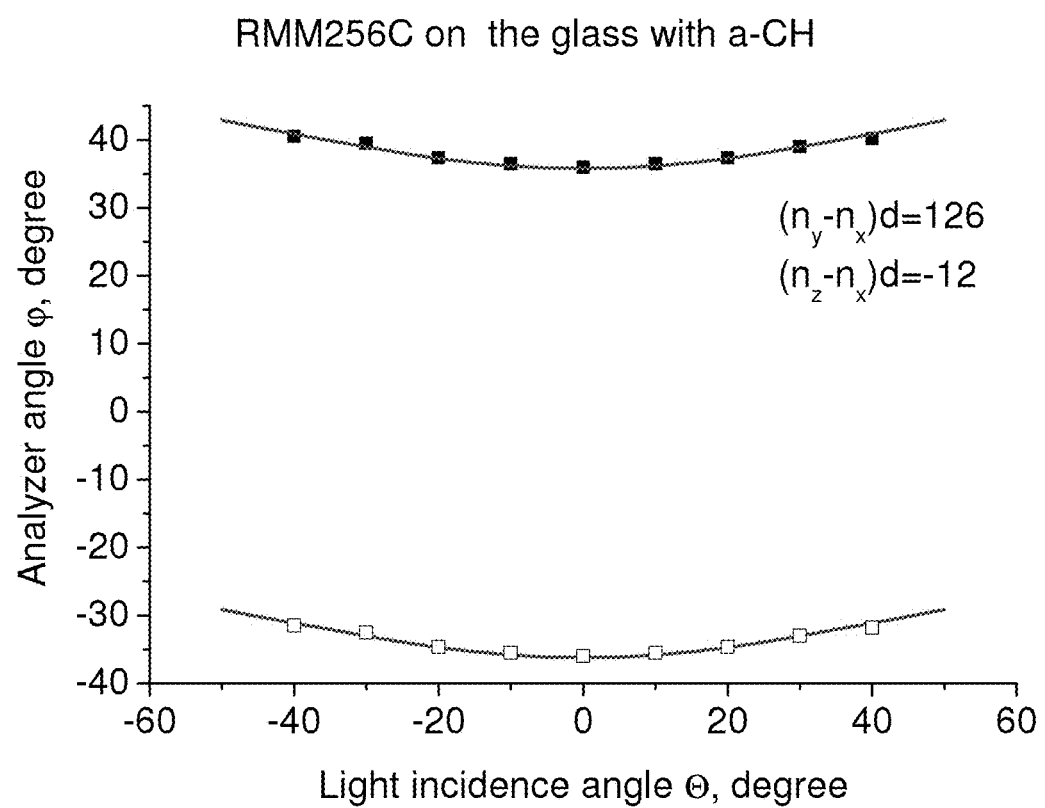
FIG. 8 shows the ellipsometric curves (analyzer angle versus testing light incidence angle curve) for a polymerized RM film with planar alignment prepared on an alignment film according to example 2.1, wherein the upper curve corresponds to horizontal and the lower curve to vertical orientation of the long sample axis x (see FIG. 3c). The dots are experimental data, while the continuous curves are fitting results.

The films of RMM141 and RMM256C demonstrate highly uniform planar alignment as depictured in FIG. 7, which shows pictures of the film of RMM256C viewed between a pair of crossed polarizers, where the alignment axis forms an angle of a) 0° and b) 45° with the axis of a polarizer. These films have the properties of a positive A plate compensation film, as can be seen in FIG. 8, which shows the ellipsometric curves (analyzer angle versus testing light incidence angle) for the film of RMM256C, wherein the upper curve corresponds to horizontal and the lower curve to vertical orientation of the long sample axis x (see FIG. 3c). The dots are experimental data, while the continuous curves are fitting results.

Figure 9:
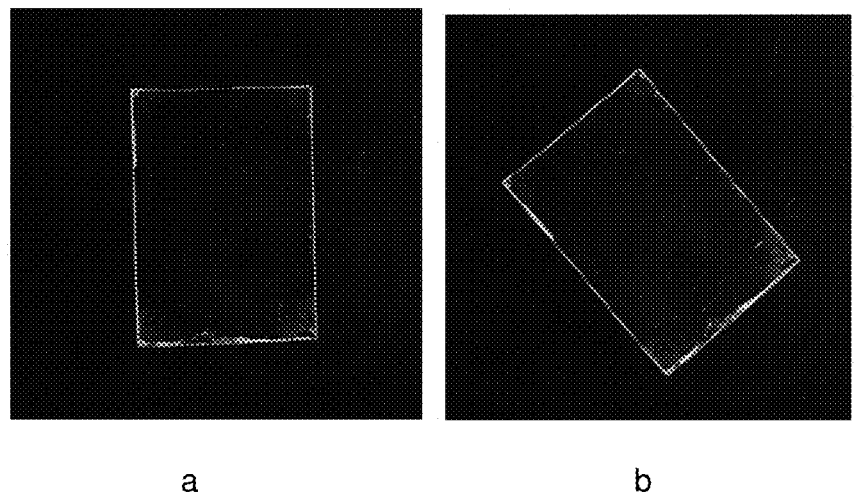
FIG. 9 shows photographs of a polymerized RM film with homeotropic alignment prepared on an alignment film according to example 2.1, viewed between a pair of crossed polarizers, where the long sample axis x is oriented at an angle of (a) 0° and (b) 45° towards one polarizer.
Figure 10:
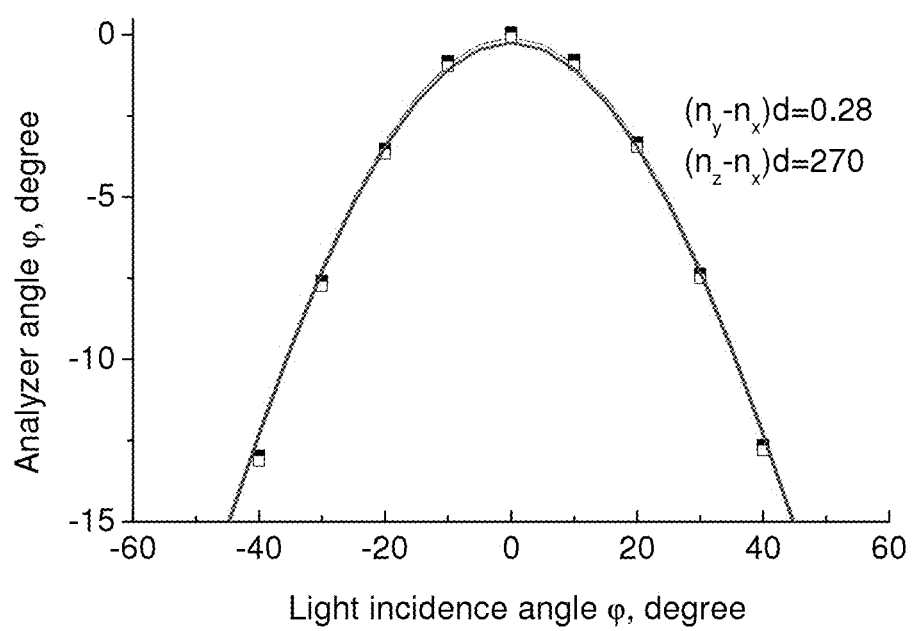
FIG. 10 shows the ellipsometric curves for a polymerized RM film with homeotropic alignment prepared on an alignment film according to example 2.1. The dots are experimental data, while the continuous curves are fitting results. The curves measured for vertical and horizontal position of long sample axis x overlap.

In turn, the films of RMM007 and RMM77 exhibit homeotropic alignment of very high quality, as can be seen in FIG. 9. which shows pictures of the film of RMM77 viewed between a pair of crossed polarizers, wherein the long sample axis x forms an angle of a) 0° and b) 45° with the axis of a polarizer. Optically, these films are equal to positive C plate compensation film, as can be seen in FIG. 10, which shows the ellipsometric curves of the film. The dots are experimental data, while the continuous curves are fitting results. The curves measured for vertical and horizontal position of long sample axis x overlap.

Figure 11:
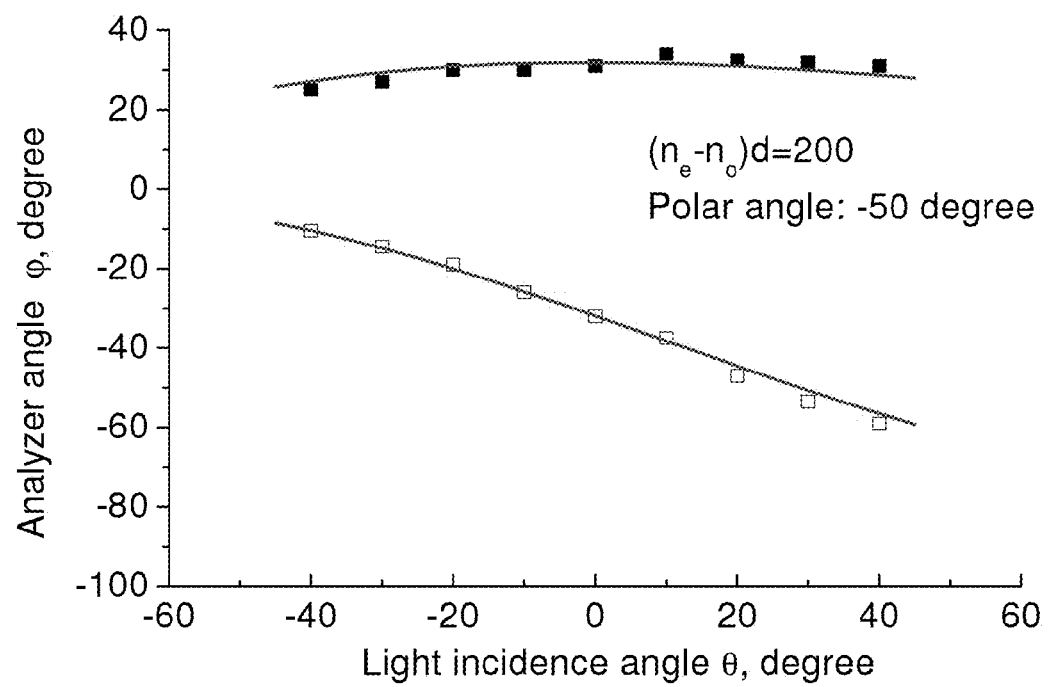
FIG. 11 shows the ellipsometric curves for a polymerized RM film with tilted alignment prepared on an alignment film according to example 2.1, wherein the upper curve corresponds to vertical and the lower curve to horizontal orientation of the in-plane projection of the alignment axis.

The film of RMM19B exhibits tilted alignment of sufficiently good quality, too. It has the properties of a positive 0 plate compensation film, as can be seen in FIG. 11, which shows the ellipsometric curve for this film, corresponds to vertical and the lower curve to horizontal orientation of the in-plane projection of the alignment axis. These data are summarized in the corresponding column of Table 2.

TABLE 2

| RM code | coating | | | | |
|---|---|---|---|---|---|
| | a-CH | a-CHN | a-CHF | a-SiO$_x$ | a-SiO$_x$H$_y$C$_z$F$_k$ |
| | optical quality/type of the film | | | | |
| 256C | ⊙/+A | ⊙/+A | ⊙/+A | ⊙/○/+A | Δ |
| 141 | ⊙/○/+A | ⊙/○/+A | — | ○/+A | X |
| 19B | ○/+○ | ○/Δ/+○ | ⊙/+C | ⊙/+C | ⊙/+C |
| 77 | ⊙/+C | ⊙/+C | ⊙/+C | ⊙/+C | ⊙/+C |
| 007 | ⊙/+C | ⊙/+C | ⊙/+C | ⊙/+C | ⊙/+C |

*Four-grade scale is used to evaluate alignment: ⊙ - excellent, ○ - good, Δ - satisfactory, X - bad.

Example 2.2

Several a-CHN films are deposited on 2×3 cm² glass slides as in Example 1.1, except that the gaseous mixture in the deposition process is CH$_4$/N$_2$ and the deposition parameters are as follows: P$_{CH4}$=7*10$^{-4}$ Torr, P$_{N2}$=1.2*10$^{-3}$ Torr, U$_a$=80 V, I=4 A, α=85°. The coating thickness is d=15 nm. The obtained films are used to align various RM mixtures as in Example 2.1. The results of the alignment tests and retardation measurements are summarized in the corresponding column of Table 2.

Example 2.3

Several a-CHF films are deposited on 2×3 cm² glass slides as in Example 1.1, except that the gaseous mixture in the deposition process is CH$_4$/CF$_4$ and the deposition parameters are as follows: P$_{CF4}$=1.2*10$^{-3}$ Torr, P$_{CF4}$=0.8*10$^{-4}$ Torr, U$_a$=90 V, I=2 A, α=85°. The coating thickness is d=15 nm. The obtained films are used to align various RM mixtures as in Example 2.1. The results of alignment tests and retardation measurements are summarized in the corresponding column of Table 2.

Example 2.4

Several a-SiO$_x$ films are deposited on 2×3 cm² glass slides as in Example 1.1, except that the gaseous mixture in the deposition process is SiH$_4$/O$_2$ and the deposition parameters are as follows: P$_{SiH4}$=2*10$^{-3}$ Torr, P$_{O2}$=3.5*10$^{-4}$ Torr, U$_a$=60 V, I=2 A, α=85°. The thicknesses of the obtained a-SiOx coating is 15 nm. These coatings are used to align various RM mixtures as in Example 2.1. The results of alignment tests and retardation measurements are summarized in the corresponding column of Table 2.

Example 2.5

Several a-SiO$_x$H$_y$C$_z$F$_k$ films are deposited on 2×3 cm² glass slides as in Example 1.1, except that the gaseous mixture in the deposition process is SiH$_4$/CF$_4$/O$_2$ and the deposition parameters are as follows: P$_{SiH4}$=2*10$^{-3}$, P$_{CF4}$=7*10$^{-4}$, P$_{O2}$=3.5*10$^{-4}$, U$_a$=80 V, I=4 A, α=85°. The thicknesses of the obtained a-SiOxC$_y$F$_z$ coating is 15 nm. These coatings are used to align various RM mixtures as in Example 2.1. The results of alignment tests and retardation measurements are summarized in the corresponding column of Table 2.

Example 2.6

Figure 12:
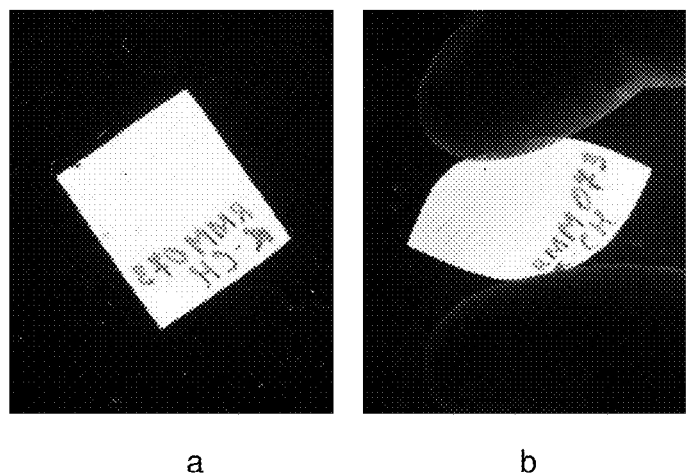
FIG. 12 shows photographs of a polymerized RM film with planar alignment prepared on an alignment film according to example 2.6, viewed between a pair of crossed polarizers, where the alignment axis (y axis, FIG. 3') is oriented at an angle of 45° towards one polarizer. (a) and (b) correspond to unbent and bent state of the film.

An a-CH coating is deposited as described in Example 1.1 on a 2×3 cm² isotropic COP strip. On the top of the a-CH film, as described in Example 2.1, is spin coated a film of the planar RMM 073. FIG. 12 shows pictures of the film of RMM 073 viewed between a pair of crossed polarizers, where the alignment axis (y axis, see FIG. 3c) is oriented at an angle of 45° towards one polarizer, and (a) and (b) correspond to unbent and bent state of the film, respectively. This demonstrates the high optical quality of this film, which has the optical properties of a positive A plate.

Example 2.7

Figure 13:
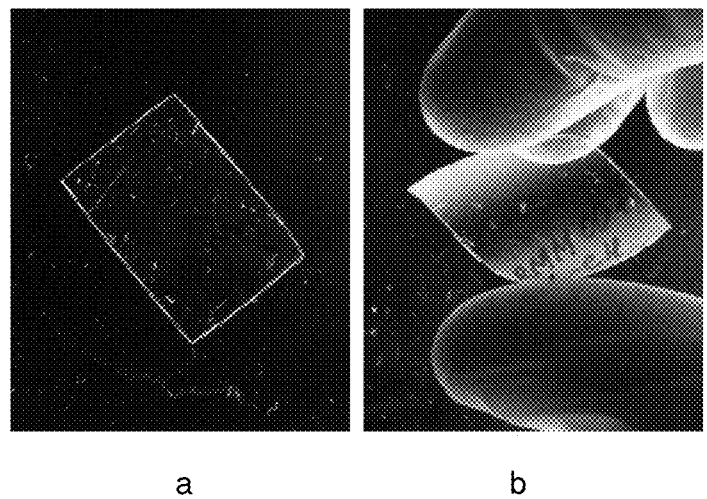
FIG. 13 shows photographs of a polymerized RM film with homeotropic alignment prepared on an alignment film according to example 2.7, viewed between a pair of crossed polarizers, where the long sample axis x is oriented at an angle of 45° towards one polarizer. (a) and (b) correspond to unbent and bent state of the film.

An a-CH coating is deposited as described in Examples 1.1 on a 2×3 cm² isotropic TAC strip. On the top of it, as described in Example 2.1, is coated a film of the homeotropic RMM 007. FIG. 13 shows pictures of the film of RMM073 viewed between a pair of crossed polarizers where the long sample axis x is oriented at an angle of 45° towards one polarizer, and (a) and (b) correspond to unbent and bent state of the film, respectively. This demonstrates the high optical quality of this film, which has the optical properties of a positive C plate.

Example 2.8

An a-CN coating is deposited as described in Example 1.1 on a 2.5×2.5 cm² glass slide containing a colour filter film. On the top of the colour filter film, as described in Example 2.1, is spin coated a film of the planar RMM 256C. It is of high optical quality and has the optical properties of a positive A plate.

Example 2.9

An a-CHF coating is deposited as described in Examples 1.1 and 1.2 on a 2.5×3.5 cm² glass slide containing a colour filter film. On the top of the colour filter film, as described in Example 2.1, is coated a film of the homeotropic RMM 007. It is of high optical quality and has the optical properties of a positive A plate.

Example 2.10

An a-CHF coating is deposited on a the 2.5×3.5 cm² glass slide as described in Examples 1.1 and 1.2, except that normal deposition (α=0) is realized. On the top of the color filter film, as described in Example 2.1, is coated a film of the homeotropic RMM 007. This film demonstrates high optical quality and has the optical properties of a positive C plate.

Example 2.11

Figure 14:
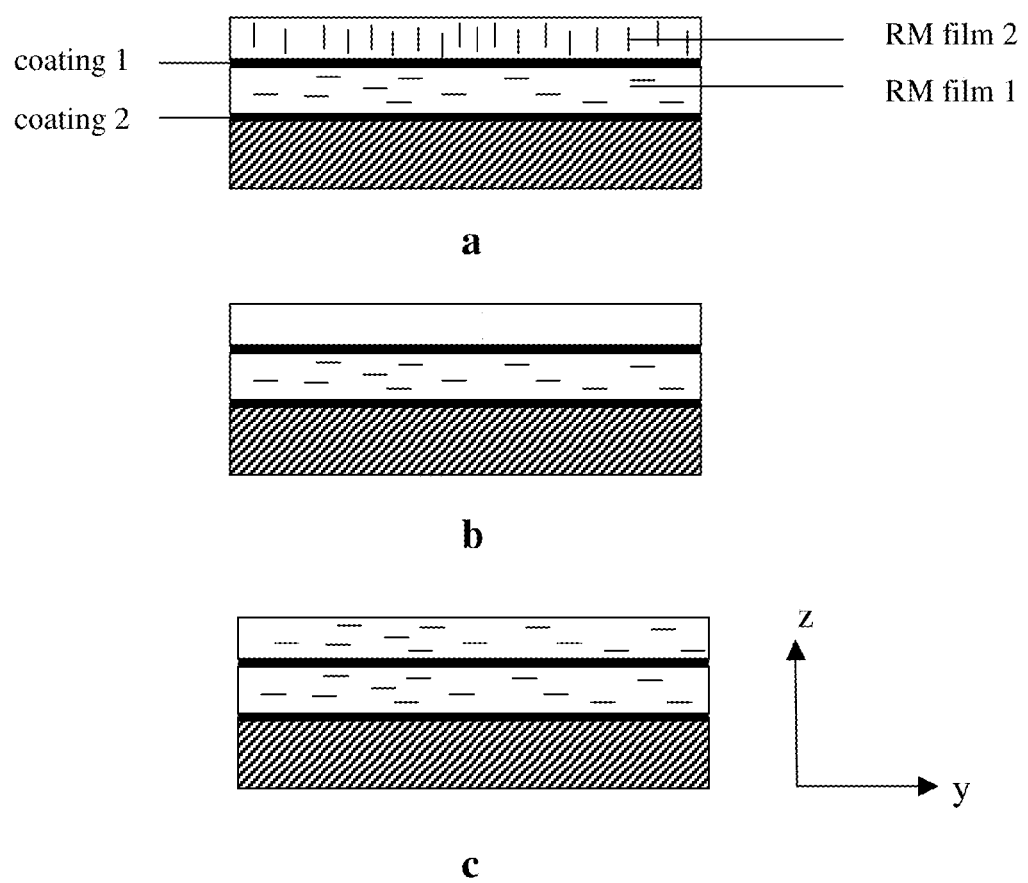
FIG. 14 schematically illustrates the preparation of RM bilayer films on alignment films prepared according to the present invention, wherein (a) shows a combination of a homeotropic and a planar RM film, (b) shows a combination of two planar RM films that are aligned in directions perpendicular to each other, and (c) shows a combination of two planar RM films that are aligned in directions parallel to each other, as described in examples 2.11-2.13.
Figure 15:
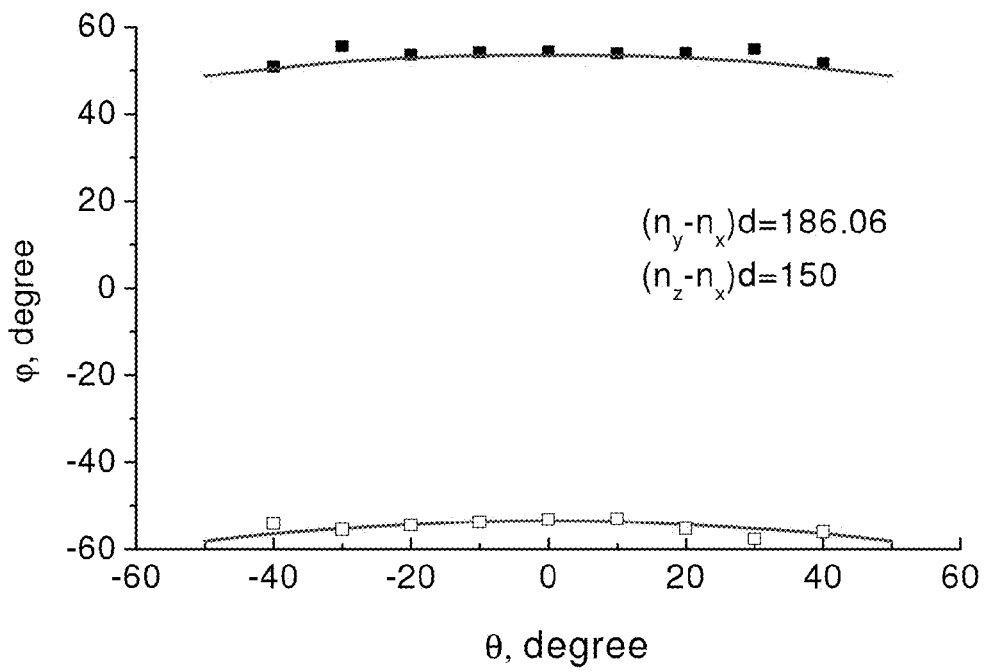
FIG. 15 shows the ellipsometric curves for a combination of a homeotropic and a planar RM film according to example 2.11, wherein the upper curve corresponds to horizontal and the lower curve to vertical orientation of the long in-plane axis of the sample (x axis). The dots are experimental data, while the continuous curves are fitting results.

An a-CHF coating is deposited on a 2×3 cm² glass slide as described in Examples 1.1 and 1.2. On the top of it the planar RMM 256C is coated as described in Example 2.1. The obtained RM film demonstrates uniform planar alignment. On the top of the first RM film a second a-CHF coating is deposited under conditions equal to the first coating. This second coating, in turn, is coated by the homeotropic RMM 007 as described in Example 2.1. In this way a double film with planar and homeotropic alignment in the sub-films is obtained, as schematically shown in FIG. 14(a). FIG. 15 demonstrates the corresponding ellipsometric curves of the sub-film with planar alignment, wherein the upper curve corresponds to horizontal and the lower curve to vertical orientation of the long in-plane axis of the sample (x axis). The dots are experimental data, while the continuous curves are fitting results. It is evident that the in-plane retardation of this film very weakly depends on the light incidence angle.

Example 2.12

Figure 16:
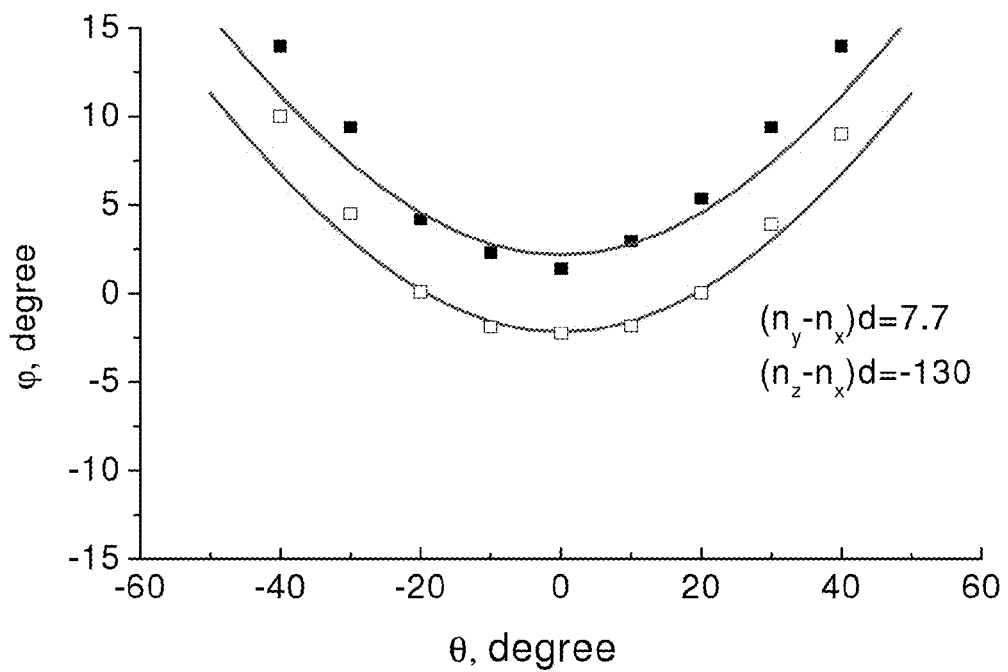
FIG. 16 shows the ellipsometric curves for a combination of two planar RM films according to example 2.12, which are aligned in mutually perpendicular directions x and y (see FIG. 3c), wherein the upper curve corresponds to horizontal and the lower curve to vertical orientation of the sample axis x. The dots are experimental data, while the continuous curves are fitting results.

An a-CHF coating is deposited on a 2×3 cm² glass slide, as described in Examples 1.1 and 1.2. On top of it the planar RMM 256C is coated as described in Example 2.1. The obtained RM film demonstrates uniform planar alignment. On the top of the first RM film, a second a-CHF coating is deposited in the direction perpendicular to the first a-CHF coating. This, in turn, is coated by the planar RMM256C as described in Example 2.1. In this way a double film with two planar RM sub-films aligned in perpendicular directions is obtained, as shown in FIG. 14(b). FIG. 16 shows the ellipsometric curve for this double film, wherein the upper curve corresponds to horizontal and the lower curve to vertical orientation of the sample axis x. The dots are experimental data, while the continuous curves are fitting results. This demonstrates that this double film has the retardation properties of a negative C plate.

Example 2.13

Figure 17:
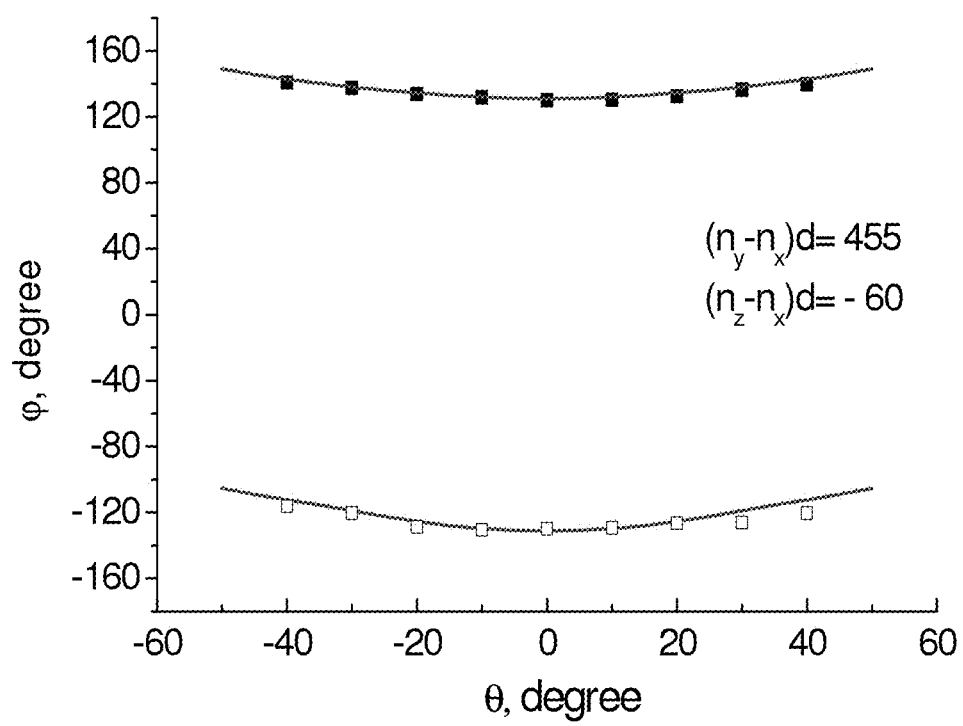
FIG. 17 shows the ellipsometric curves for a combination of two planar RM films according to example 2.12, which are aligned in directions paralle to each other (in direction of y sample axis, see FIG. 3c), wherein the upper curve corresponds to horizontal and the lower curve to vertical orientation of the long sample axis x. The dots are experimental data, while the continuous curves are fitting results.

An a-CHF coating is deposited on a 2×3 cm² glass slide as described in Examples 1.1 and 1.2. On top of it the planar RMM 256C is coated as described in Example 2.1. The obtained RM film demonstrates uniform planar alignment. On the top of the first RM film a second a-CHF coating is deposited under conditions equal to the first coating. This, second coating, in turn, is coated by a second planar RMM 256C film. In this way a double film containing two planar RM sub-films with parallel alignment is obtained, as shown in FIG. 14(c). FIG. 17 shows the ellipsometric curves for this double film, which are aligned in directions paralle to each other (in direction of y sample axis, see FIG. 3c), wherein the upper curve corresponds to horizontal and the lower curve to vertical orientation of the long sample axis x. The dots are experimental data, while the continuous curves are fitting results. This demonstrates that this double film has the retardation properties of a positive A plate. The in-plane retardation of this film is doubled, compared to the retardation of a single film.

3. Combination of Direct Deposition and Etching Process

Example 3.1

Several a-CH coatings are produced on glass substrates as in Example 1.1. Subsequently, the end-Hall source is switched in the cleaning regime and the substrates are etched for 3 min. The cleaning conditions are the same as in Example 1.1. The symmetric cell is assembled so that particle beam treatment directions on the opposite substrates are antiparallel. The cell has a thickness 15 μm and is filled with ZLI-2293. The uniform LC alignment in the beam processing direction is observed in the cell. The pretilt angle is about 2.6°.

Example 3.2

An a-CHF coating is deposited on a 2×3 cm² glass slide as described in Examples 1.1 and 1.2. On top of it the homeotropic RMM007 is coated as described in Example 2.1. The obtained RM film demonstrates highly uniform homeotropic alignment. This RM film is subsequently obliquely etched with the Ar⁺ beam from the anode layer source of linear construction. The processing conditions are as follows: basic vacuum P=4.5 10⁻⁵ Torr, working pressure $P_{Ar}$=6 10⁻⁴ Torr, anode potential $U_a$=600 V, ion current density in the beam j=7 μA/cm², plasma beam incidence angle α=85°. On the top of the treated RM film a film of planar RMM256C is spin coated. A double film of excellent optical uniformity is obtained. The ellipsometric curves of this double film are similar to those described in Example 2.11.

The invention claimed is:

1. A process of preparing an alignment film on a substrate, said film being suitable for the alignment of liquid crystals or reactive mesogens, comprising exposing the substrate, directly or through a mask, to a beam of weakly accelerated particles having a predominant particle energy from 1 to 100 eV, thereby providing a deposited layer of particles on the substrate.

2. A process according to claim 1, wherein the particle beam is a plasma beam.

3. A process according to claim 1, wherein the particle beam is an ion beam.

4. The process according to claim 1, wherein the substrate comprises an organic or inorganic material.

5. The process according to claim 1, wherein the substrate is glass, quartz, silicon or plastic plates or foils, optionally containing one or more electrode layers or other electronic structures suitable for electrically addressing LC molecules, or a color filter.

6. The process according to claim 1, wherein the alignment film is a layer of a-CH, a-CHF, a-CHN, a-SiO$_x$, a-SiN$_x$, a-SiO$_x$N$_y$, a-SiO$_x$H$_y$C$_z$F$_k$.

7. The process according to claim 1, comprising using the particle or plasma beam generated from a gas or a mixture of two or more gases that are reactive gases doped by one or more rare gases.

8. The process according to claim 1, wherein at least a portion of the substrate is exposed to a particle beam from a plasma or ion beam source (deposition), wherein the particle beam is directed at the substrate such that the symmetry axis of the source (particle beam direction) forms an angle to the normal of the substrate ("incidence angle"), wherein said incidence angle is from 0° to 89°.

9. The process according to claim 1, comprising using a particle or plasma beam source that is an end-Hall source.

10. The process according to claim 1, wherein the predominant particle energy is from 1 to 50 eV.

11. The process according to claim 1, wherein a first alignment film is coated by a second alignment film that is prepared by a process as described in claim 1, wherein the particle beam in the process for preparing the second alignment film is directed in the same direction or in a different direction as in the process for preparing the first alignment film.

12. The process according to claim 1, wherein the substrate, before deposition, is subjected to a pre-cleaning step, by exposing it to a particle beam, having a predominated particle energy of >100 eV.

13. The process according to claim 1, wherein the alignment layer after deposition is subjected to surface etching, by exposing it to a particle beam having a predominant particle energy of >100 eV, wherein the particle beam is directed at the substrate such that the incidence angle is from 30° to 89°.

14. A method comprising using an alignment film, prepared by a process according to claim 1 for the alignment of liquid crystals (LCs) or reactive mesogens (RMs), which are applied onto said alignment film layer.

15. A process of preparing a multilayer construct comprising an alignment film prepared according to claim 1 and one or more LC and/or RM layers applied thereon, comprising
- A) exposing a substrate, directly or through a mask, to a beam of weakly accelerated particles having a particle energy of 1-100 eV, thereby forming a first alignment film by direct particle deposition (deposition),
- A1) optionally exposing the deposited alignment film, directly or through a mask, to a beam of accelerated particles having a predominated energy of >100 eV, thereby providing anisotropic etching of the deposited film (surface etching),
- B) applying one or more layers comprising one or more LCs and/or RMs, and optionally comprising one or more polymerizable non-mesogenic compounds, on the first alignment film prepared in A,
- C) optionally polymerizing one or more of the RM(s) and/or of the polymerizable non-mesogenic compound(s) in at least one of the layers prepared in B,
- D) optionally depositing a second alignment film, by a deposition as described in step A, on the LC or RM layer(s) prepared in B or C,
- D1) optionally subjecting the second alignment film to a surface etching as described in A1,
- E) optionally applying one or more layers comprising one or more LCs and/or RMs, and optionally comprising one or more polymerizable non-mesogenic compounds, on the second alignment film prepared in D,
- F) optionally polymerizing one or more of the RM(s) and/or of the polymerizable non-mesogenic compound(s) in at least one of the layers prepared in E),
- G) optionally depositing a top layer having antiscretching, gas barrier or antireflection function, by a deposition step as described in A, on the multilayer prepared by A-F, wherein D)-F) are optionally repeated once or two or more times.

16. A method comprising using an alignment film prepared according to claim 1, optionally as a multilayer, in optical, electronic and electrooptical applications and devices.

17. The process according to claim 7, wherein the reactive gases are hydrocarbons or fluorocarbons.

18. The process according to claim 17, wherein the reactive gases are $CH_4$, $C_2H_6$, $C_2H_4$, $C_2H_2$, $CF_4$, $C_2F_4$, $SiH_4$, $N_2H_2$ or $O_2$.

19. The process according to claim 7, wherein the rare earth gases are Ar, Kr, He, Xe or Ne.

20. The process according to claim 1, wherein the predominant particle energy is from 1 to 95 eV.

21. The process according to claim 1, wherein the predominant particle energy is from 1 to less than 100 eV.

* * * * *